US011901351B2

(12) United States Patent
Current et al.

(10) Patent No.: US 11,901,351 B2
(45) Date of Patent: *Feb. 13, 2024

(54) THREE DIMENSIONAL INTEGRATED CIRCUIT WITH LATERAL CONNECTION LAYER

(71) Applicant: Silicon Genesis Corporation, Fremont, CA (US)

(72) Inventors: Michael I. Current, San Jose, CA (US); Theodore E. Fong, Pleasanton, CA (US)

(73) Assignee: Silicon Genesis Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,477

(22) Filed: Aug. 8, 2022

(65) Prior Publication Data

US 2023/0215857 A1 Jul. 6, 2023

Related U.S. Application Data

(63) Continuation of application No. 17/497,804, filed on Oct. 8, 2021, now Pat. No. 11,410,984.

(51) Int. Cl.
*H01L 25/00* (2006.01)
*H01L 21/48* (2006.01)
(Continued)

(52) U.S. Cl.
CPC ............ *H01L 25/50* (2013.01); *H01L 21/486* (2013.01); *H01L 21/60* (2021.08);
(Continued)

(58) Field of Classification Search
CPC ...... H01L 25/50; H01L 25/0657; H01L 21/60; H01L 21/486; H01L 21/76802; H01L 21/78; H10B 80/00
See application file for complete search history.

(56) References Cited

U.S. PATENT DOCUMENTS 6,120,597 A 9/2000 Levy et al.
6,346,459 B1 2/2002 Usenko et al.
(Continued)

OTHER PUBLICATIONS

International Search Report for related PCT/US2022/077180, dated Jan. 18, 2023.
(Continued)

*Primary Examiner* — Timor Karimy

(57) ABSTRACT

Forming a 3DIC includes providing a lower device structure comprising a first substrate with a circuit layer, providing an interconnect network layer having an interconnect structure with a first coupled to a second plurality of electrodes by connection structures on a semiconductor substrate, the first plurality of electrodes being exposed on a first surface of the interconnect layer, implanting ions through the interconnect structure to form a cleave plane in the semiconductor substrate, bonding the interconnect structure to the lower device structure so that electrodes of the first plurality of electrodes are coupled to corresponding electrodes on the lower device structure, cleaving the substrate of the bonded interconnect layer at the cleave plane, removing material from the semiconductor substrate until the second plurality of electrodes is exposed, and bonding an upper device layer to the interconnect structure.

20 Claims, 16 Drawing Sheets

(51) Int. Cl.
  *H01L 21/60* (2006.01)
  *H01L 23/00* (2006.01)
  *H01L 21/78* (2006.01)
  *H01L 21/768* (2006.01)
  *H01L 25/065* (2023.01)

(52) U.S. Cl.
  CPC ........ *H01L 21/76802* (2013.01); *H01L 21/78* (2013.01); *H01L 24/95* (2013.01); *H01L 25/0657* (2013.01)

(56) References Cited

U.S. PATENT DOCUMENTS

| | | | |
|---|---|---|---|
| 6,528,391 | B1 | 3/2003 | Henley et al. |
| 6,573,565 | B2 | 6/2003 | Clevenger et al. |
| 6,764,898 | B1 | 7/2004 | En et al. |
| 6,780,759 | B2 | 8/2004 | Farrens et al. |
| 6,881,644 | B2 | 4/2005 | Malik et al. |
| 6,908,832 | B2 | 6/2005 | Farrens et al. |
| 7,078,317 | B2 | 7/2006 | Henley |
| 7,094,666 | B2 | 8/2006 | Henley et al. |
| 7,160,790 | B2 | 1/2007 | Henley et al. |
| 7,166,520 | B1 | 1/2007 | Henley |
| 7,348,258 | B2 | 3/2008 | Henley et al. |
| 7,351,644 | B2 | 4/2008 | Henley |
| 7,354,815 | B2 | 4/2008 | Henley |
| 7,371,660 | B2 | 5/2008 | Henley et al. |
| 7,378,330 | B2 | 5/2008 | Henley et al. |
| 7,390,724 | B2 | 6/2008 | Henley et al. |
| 7,391,047 | B2 | 6/2008 | Henley et al. |
| 7,399,680 | B2 | 7/2008 | Henley |
| 7,427,554 | B2 | 9/2008 | Henley et al. |
| 7,462,526 | B2 | 12/2008 | Henley |
| 7,479,441 | B2 | 1/2009 | Kirk et al. |
| 7,595,499 | B2 | 9/2009 | Henley et al. |
| 7,598,153 | B2 | 10/2009 | Henley et al. |
| 7,629,666 | B2 | 12/2009 | Henley |
| 7,759,220 | B2 | 7/2010 | Henley |
| 7,772,088 | B2 | 8/2010 | Henley et al. |
| 7,910,458 | B2 | 3/2011 | Henley |
| 8,012,851 | B2 | 9/2011 | Henley et al. |
| 8,071,463 | B2 | 12/2011 | Henley |
| 8,124,499 | B2 | 2/2012 | Henley et al. |
| 8,133,800 | B2 | 3/2012 | Henley et al. |
| 8,143,165 | B2 | 3/2012 | Henley |
| 8,153,513 | B2 | 4/2012 | Henley |
| 8,222,119 | B2 | 7/2012 | Henley |
| 8,241,996 | B2 | 8/2012 | Henley et al. |
| 8,293,619 | B2 | 10/2012 | Henley |
| 8,329,557 | B2 | 12/2012 | Brailove et al. |
| 8,330,126 | B2 | 12/2012 | Henley et al. |
| 8,395,259 | B2 | 3/2013 | Eun |
| 8,637,382 | B2 | 1/2014 | Henley |
| 9,336,989 | B2 | 5/2016 | Henley |
| 9,362,439 | B2 | 6/2016 | Henley |
| 9,460,908 | B2 | 10/2016 | Henley |
| 10,049,915 | B2 | 8/2018 | Fong et al. |
| 10,804,252 | B2 | 10/2020 | Fong et al. |
| 2002/0173872 | A1 | 11/2002 | Malik |
| 2005/0104027 | A1 | 5/2005 | Lazarev |
| 2005/0150597 | A1 | 7/2005 | Henley et al. |
| 2005/0247668 | A1 | 11/2005 | Malik et al. |
| 2006/0240645 | A1 | 10/2006 | Henley |
| 2007/0029043 | A1 | 2/2007 | Henley |
| 2007/0032044 | A1 | 2/2007 | Henley |
| 2007/0051299 | A1 | 3/2007 | Ong et al. |
| 2008/0044938 | A1 | 2/2008 | England et al. |
| 2008/0128641 | A1 | 6/2008 | Henley et al. |
| 2008/0206963 | A1 | 8/2008 | Henley et al. |
| 2009/0152162 | A1 | 6/2009 | Tian et al. |
| 2014/0145272 | A1 | 5/2014 | Or-Bach et al. |
| 2014/0329372 | A1 | 11/2014 | Aga et al. |
| 2016/0204088 | A1 | 7/2016 | Fong et al. |
| 2017/0301657 | A1* | 10/2017 | Fong .................. H01L 21/8221 |
| 2018/0025970 | A1 | 1/2018 | Kao et al. |
| 2018/0350785 | A1 | 12/2018 | Fong et al. |
| 2021/0125967 | A1 | 4/2021 | Zhai |
| 2021/0242184 | A1 | 8/2021 | Fong et al. |

OTHER PUBLICATIONS

2014 SOI-3D-Subthreshold Microelectronics Technology Unified Conference (S3S), IEEE. 2014, p. 1.
2015 SOI-3D-Subthreshold Microelectronics Technology Unified Conference (S3S), IEEE, 2015, p. 1.
Beyne, "Next Technologies for Further Adoption of 3D System Integration Technologies," European 3D TSV Summit, IMEC, 2016, p. 33.
Chen, et al., "Materials Challenges inTthree-Dimensional Integrated Circuits," MRS Bulletin, 2015, vol. 40 (3), pp. 219-222.
Chen, et al., "Vertical Interconnects of Microbumps in 3D Integration," MRS Bulletin, 2015, vol. 40 (3), pp. 257-263.
Clermidy, et al., "Technology Scaling: The CoolCubeTM Paradigm," IEEE, SOI-3D-Subthreshold Microelectronics Technology Unified Conference (S3S), 2015, pp. 4.
Current, et al., "Preliminary Steps Towards Implementing Intimate 3D-IC Stacking with Layer Transfer and Atomic Bonding Methods," IEEE SOI-3D-Subthreshold Microelectronics Technology, 2015, pp. 3.
Du, et al. "Emerging 3DVLSI: Opportunities and Challenges," IEEE, SOI-3D-Subthreshold Microelectronics Technology Unified Conference (S3S), 2015, pp. 5.
Ebrahimi, et al., "Monolithic 3D Integration Advances and Challenges: From Technology to System Levels," IEEE, SOI-3D-Subthreshold Microelectronics Technology Unified Conference (S3S), 2014, pp. 2.
Fitzgerald, et al., "Monolithic 3D Integration in a CMOS Process Flow," IEEE, SOI-3D-Subthreshold Microelectronics Technology Unified Conference (S3S), 2014, pp. 3.
Gu, "Material Innovation Opportunities for 3D Integrated Circuits from a Wireless Application Point of View," MRS Bulletin, 2015, vol. 40 (3), pp. 233-241.
Heinig, "Enabling 3D Systems—A Comprehensive Approach from Design to Technology," European 3D Summit, 2016, pp. 27.
Yer, "Monolithic Three-Dimensional Integration for Memory Scaling and Neuromorphic Computing," IEEE, SOI-3D-Subthreshold Microelectronics Technology Unified Conference (S3S), 2015, pp. 7.
Yer, "Three-Dimensional Integration: An Industry Perspective," MRS Bulletin, 2015, vol. 40 (3), pp. 225-232.
Jiang, et al., "Through-Silicon via Stress Characteristics and Reliability Impact on 3D Integrated Circuits," MRS Bulletin, 2015, vol. 40 (3), pp. 248-256.
Koyanagi, et al., "Applications of Three-Dimensional LSI," Mrs Bulletin, 2015, vol. 40 (3), pp. 242-247.
Liu, et al., "Sustaining the Silicon Revolution: From 3-D Transistors to 3-D Integratio," IEEE, SOI-3D-Subthreshold Microelectronics Technology Unified Conference (S3S), 2015, pp. 3.
Maleville, "Engineered Substrates for Moore and More than Moore's Law: Device Scaling: Entering the Substrate Era," IEEE, SOI-3D-Subthreshold Microelectronics Technology Unified Conference (S3S), 2015, pp. 5.
Mitra, "From Nanodevices to Nanosystems: The N3XT Information Technology," IEEE, SOI-3D-Subthreshold Microelectronics Technology Unified Conference (S3S), 2015, p. 1.
Nayak, et al., "Power, Performance, and Cost Comparisons of Monolithic 3D ICs and TSV-Based 3D ICs," IEEE SOI-3D-Subthreshold Microelectronics Technology, 2015, pp. 2.
Or-Bach, et al., "Modified ELTRAN® —A Game Changer for Monolithic 3D," IEEE SOI-3D-Subthreshold Microelectronics Technology, 2015, pp. 3.
Or-Bach, et al., "Precision Bonders—A Game Changer for Monolithic 3D," IEEE, SOI-3D-Subthreshold Microelectronics Technology Unified Conference (S3S), 2014, pp. 4.
Pabo, "Heterogeneous Integration Enabled by Advanced Wafer Bonding," IEEE 3S3 Proceedings, 2015, http://http://s3sconference.org/program/highlights-of-our-2015-conference/, pp. 3.

(56) References Cited

OTHER PUBLICATIONS

Panth, et al., "Design challenges and solutions for ultra-high-density monolithic 3D ICs," IEEE, SOI-3D-Subthreshold Microelectronics Technology Unified Conference (S3S), 2014, pp. 2.

Patton, "New Game-Changing Product Applications Enabled by SOI," IEEE, SOI-3D-Subthreshold Microelectronics Technology Unified Conference (S3S), 2015, p. 1.

PCT Search Report for Application No. PCT/US18/63328, dated Mar. 26, 2019.

Proton Energy Requirements for M3D Layer Splitting: Rev2, 2014, pp. 1-10.

Report on S3S14: SOI-3D-Subthreshold Microelectronic Technology Unified Conference, IEEE, 2014, pp. 1-11.

Sekar, "3D memory with Shared Lithography Steps: The memory industry's plan to Cram more Components onto Integrated Circuits,".

Sollier, et al., "300 mm InGaAsOI Substrate Fabrication using the Smart CutTM Technology," IEEE, SOI-3D-Subthreshold Microelectronics Technology Unified Conference (S3S), 2015, pp. 2.

Sugaya, et al., "New Precision Alignment Methodology for CMOS Wafer Bonding," IEEE, SOI-3D-Subthreshold Microelectronics Technology Unified Conference (S3S), 2014, pp. 3.

Torki, "3D-IC Integration," CMP Annual Users Meeting, 2013, pp. 47.

Uhrmann, et al., "Monolithic IC Integration Key Alignment Aspects for High Process Yield," IEEE, SOI-3D-Subthreshold Microelectronics Technology Unified Conference (S3S), 2014, pp. 2.

Vinet, et al., "Monolithic 3D Integration: A powerful Alternative to Classical 2D Scaling ," IEEE, SOI-3D-Subthreshold Microelectronics Technology Unified Conference (S3S), 2014, pp. 3.

Yonehara, "Epitaxial Layer Transfer Technology and Application," IEEE SOI-3D-Subthreshold Microelectronics Technology, 2015, p. 1.

Extended European Search Report for EP 18883845.2, dated Aug. 3, 2021.

\* cited by examiner

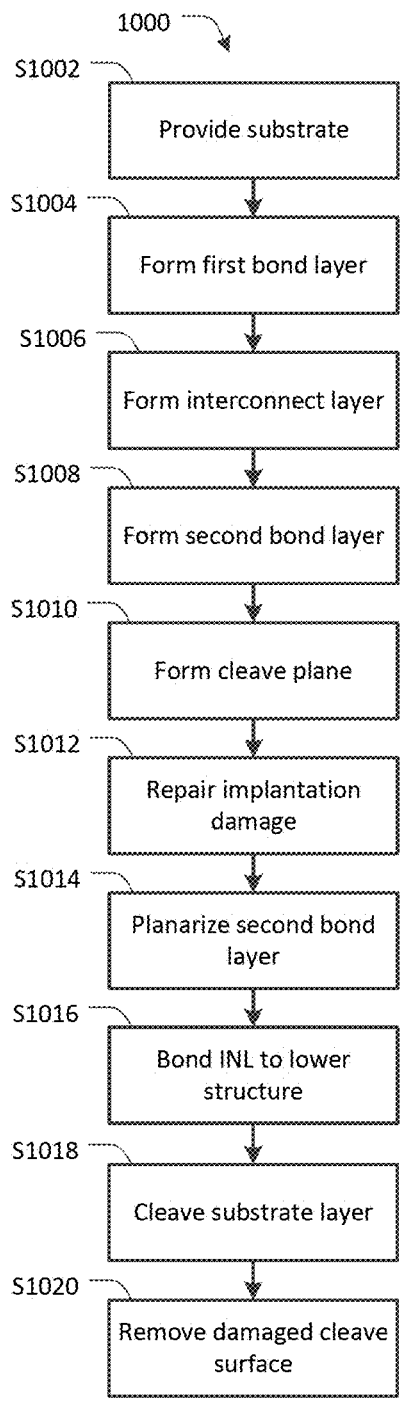
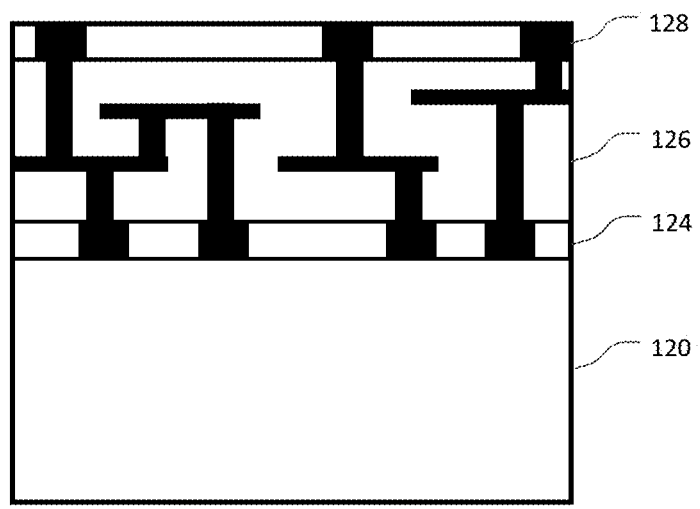
Fig. 11A
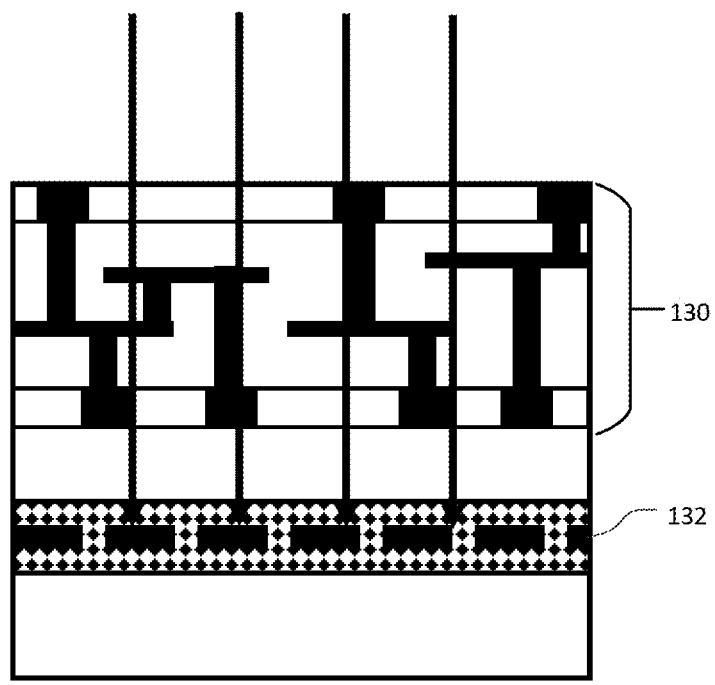
Fig. 10
Fig. 11B

THREE DIMENSIONAL INTEGRATED CIRCUIT WITH LATERAL CONNECTION LAYER

CROSS-REFERENCE TO RELATED APPLICATION

This application is a continuation of and claims priority to U.S. patent application Ser. No. 17/497,804, filed Oct. 8, 2021, the contents of which are incorporated herein in their entirety.

BACKGROUND

Although the die in wafer scale layers in a 3DIC stack are expected to usually be composed of identical chip types, memory, logic, image sensing and processing and the like, die scale layers can be expected to be composed of diverse circuit types, such as RF signal processing, Wi-Fi and other forms of local and global network communications, diverse analog chip types, other specialty chip types with diverse lateral and thickness dimensions and composed of diverse substrate materials.

The system requirements for such complex 3DIC networks, combining wafer and die scale bonding and stacking can be expected to include inter-chip communication, timing, ground and power connections that extend well beyond vertical inter-die conductive lines and to include provisions of lateral signal and other connections throughout the 3DIC system stack.

In present day multi-die packaging methods, often referred to as 2.5D integration schemes, the need for vertical signal and power connections are provided by variations on TSV (through-silicon vias) and the main lateral signal and power connections are embedded in a variety of RDL (redistribution layers) often fabricated in a variety of "interposer" layers with Silicon, glass or plastic substrates that are incorporated into the multi-die, multi-level packages in the later stages of 2.5D integration. An interposer layer is typically disposed at the base of a 2.5D structure that provides lateral connections between dies that are stacked on the same vertical plane above the interposer.

The present level of lateral signal, power, ground and timing synchronization connections in 2.5D packaging have a diverse range of limitations for performance, thermal, economic and component availability.

Internal stress and alignment compensation for thick RDL interposers limits vertical interconnect density which can be patterned and align bonded with 2.5D materials and components. Conventional interposers, which include structures build on thinned silicon as well as plastic and glass ($SiO_2$) substrates, have thicknesses of between 30 and 100 µm. The ratio of via depth to thickness of the connecting metal filler for such interposers are typically on the scale of 10:1, so the vias for TSVs in conventional interposers are typically around 3-10 µm, resulting in relatively low connection density. In addition, the density and physical dimensions of vertical conductive signal connections which can be etched and fabricated are generally linked to the thickness of the interposer or other forms of signal transfer layers. Common rules of thumb for practical vertical channel etching and backfill with multiple layers of conductive materials with adequate metal diffusion barriers are that vertical conductive channels can be reliably formed with diameters of one tenth of the vertical distance over which one forms the signal connections.

In addition to taking up larger lateral areas, thicker metal connections also increase the die-level stress arising from differences in the coefficients of thermal expansion (CTEs) for the connecting metal, commonly Copper, and die components, commonly Silicon and various dielectrics, introducing strains in the die device levels which alter and generally degrade the device performance characteristics, such as shifts in transistor threshold voltage (Vth) and the like. The practical response to these issues in 2.5D packaging is to restrict the density of vertical connection lines by inserting in the device design process "kill zone" regions around the vertical signal connection points, e.g. TSVs, where active circuit elements are not allowed within the regions of this stress around the Cu vertical metal lines.

In addition to reducing the area on the die available for active circuit elements, the diameter and stress associated with micron-diameter Cu vertical connection lines also restricts the density of vertical, inter-level connections which can be built into the 2.5D package system. Since inter-device signal bandwidth is directly proportional to the density of active signal channels, it is desirable to increase interconnected signal density by efficient 3DIC stacking to provide increased signal processing through increased internal bandwidth.

TECHNICAL FIELD

The present disclosure relates generally to the manufacture of integrated circuit devices. More particularly, the present disclosure provides a method and resulting devices for stacking and interconnecting three-dimensional devices using heterogeneous and non-uniform layers, such as fully fabricated integrated circuits. By way of example, the integrated circuits can include, among others, memory devices, processor devices, digital signal processing devices, application specific devices, controller devices, communication devices, and others.

SUMMARY

Embodiments of the present disclosure relate to semiconductor devices including ion cleaving technology. Embodiments may be employed to form three-dimensional integrated circuit (3DIC) by implanting ions through a circuit layer to form a cleave plane, repairing damage caused by the implantation, and stacking semiconductor substrates. The substrates may be processed at the wafer scale.

To address the challenges outlined above, high bandwidth and concomitant high signal transfer rates in 3D multi-chip assemblies call for lateral (as well as vertical) signal interconnect networks which span beyond the lateral dimensions of the individual chip level circuits. The lateral dimensions of an individual chip circuit are constrained by the maximum field of view of available high-resolution optical lithography, at present, 2.6 by 3.3 cm. Embodiments of the layer transfer methods described by the present disclosure for formation of high bandwidth interconnections within a 3DIC stack are well suited for wafer-level transfers. This property provides the ability to fabricate signal interconnect layers which extend over the combined lateral dimensions of even the largest chip components by use of available lithographic edge of view alignment methods.

Embodiments of the present disclosure include an interconnect network layer which may be designed and fabricated as an independent component for insertion into diverse 3D, multi-chip packaging schemes, subject to systematic use of appropriate standards for location of bonding contacts and signal distribution paths.

In an embodiment, the interconnect network layer provides for signal, power, timing and other electrical connections linking electronic device elements with direct path, high density, high bandwidth signal transmission in both vertical, linking multi layers of a 3DIC structure, and lateral directions, spanning across one or more device elements in the 3DIC system.

In an embodiment, a method for forming a three-dimensional integrated circuit (3DIC) includes providing a lower device structure comprising a first substrate with a circuit layer, providing an interconnect network layer having an interconnect structure on a semiconductor substrate, the interconnect structure having a first plurality of electrodes, a second plurality of electrodes, and a plurality of connection structures coupling the first plurality of electrodes to the second plurality of electrodes, the first plurality of electrodes being exposed on a first surface of the interconnect layer, implanting ions through the interconnect structure to form a cleave plane in the semiconductor substrate, bonding the interconnect structure to the lower device structure so that electrodes of the first plurality of electrodes are coupled to corresponding electrodes on the lower device structure, cleaving the substrate of the bonded interconnect layer at the cleave plane, removing material from the semiconductor substrate until the second plurality of electrodes is exposed, and bonding an upper device layer to the interconnect structure. The method may include exposing the first substrate to a hydrogen gas mixture for a first time at a first temperature to repair damage to the interconnect network layer caused by the implanted ions after implanting the ions through the interconnect network structure. In an embodiment, the first temperature is from 300° C. to 500° C., the hydrogen gas mixture includes at least 1% hydrogen, and the time is at least 30 minutes.

In an embodiment, the method includes forming the electrodes on the lower device structure, polishing an exposed surface of the lower device structure including the electrodes on the lower device structure so that the exposed surface has a flatness that is suitable for atomic bonding to the interconnect network layer, and atomic bonding the interconnect network layer to the lower device structure. In an embodiment, removing material from the semiconductor substrate includes removing material until the interconnect network layer has a thickness of 0.5 μm or less. In an embodiment, the lower device structure comprises a lower wafer-scale device layer with a plurality of die-scale devices stacked on the lower wafer-scale device layer. The method may further include etching a plurality of openings into the dies, and depositing a metal material in the plurality of openings to form vias that extend from the dies, wherein at least a portion of the electrodes on the lower device structure are coupled to the vias.

The interconnect network layer may include a plurality of lateral connections. A portion of the lateral connections may offset a vertical connection from a first location in a horizontal plane to a second location in the horizontal plane. A portion of the lateral connections in the interconnect network layer may electrically couple one electrode of the first plurality of electrodes to at least two electrodes of the second plurality of electrodes, or couple at least two electrodes of the first plurality of electrodes to one electrode of the second plurality of electrodes.

In an embodiment, the method for forming a three-dimensional integrated circuit (3DIC) is performed at an outside assembly and test (OSAT) facility.

The method may further include implanting ions through the circuit layer of a first wafer-scale device to form a cleave plane in a first substrate under the circuit layer, and cleaving the first substrate at the cleave plane, wherein the first wafer-scale device is included in the lower device structure. The 3DIC structure may include at least three wafer-scale device layers and at least one die-scale device layer, and at least one of the wafer-scale device layers or the die-scale device layer may include a network of cooling channels configured to convey a fluid to remove heat from the 3DIC. The method may include fabricating the interconnect network layer.

In an embodiment, the interconnect network layer includes conductive interconnect structures that extend in both vertical and lateral directions, the interconnect structures including at least one power interconnect structure, at least one signal interconnect structure, and at least one timing interconnect structure, wherein the power interconnect structure transmits power between a device of the upper device layer and the lower device structure, the signal interconnect structure conveys data between the device of the upper device layer and the lower device structure, and the timing interconnect structure transmits clock signals between the upper device layer and the lower device structure.

In an embodiment, process of forming a 3DIC includes providing a first substrate with a circuit layer that includes plurality of dielectric and conductive structures, implanting ions through the circuit layer and into the first substrate to form a cleave plane, and after implanting the ions through the circuit layer, exposing the semiconductor substrate to a hydrogen gas mixture for a first time at a first temperature to repair damage caused by the implanted ions. A first portion of the first substrate with the plurality of dielectric and conductive structures disposed thereon is separated from a second portion of the first substrate by cleaving at the cleave plane, the first portion of the substrate is bonded to a second substrate. At least a portion of the conductive structures of the first substrate may subsequently be connected to conductive structures of the second substrate. The first temperature may be from 300 C to 500 C, and the time may be at least one-half hour. The conductive and dielectric structures may include high-K dielectric structures comprising at least one material with a K of 10 or greater.

The first and second substrates may be wafer scale substrates, and the first substrate may not be exposed temperatures above, for example, 300 C, 400 C, 450 C or 500 C after implanting the ions and before separating the first portion from the second portion.

In an embodiment, the hydrogen gas mixture has at least 1% hydrogen gas and a remainder of the gas mixture is one or more inert gas. For example, the gas mixture may be a forming gas.

The ions may be implanted at a temperature of less than 100 C and a proton energy that is sufficient to place a majority of recoil damage and the cleave plane deeper than a depletion layer thickness of an operating transistor.

In an embodiment, a process for repairing damage caused by implanting ions through a circuit layer that includes conductive and dielectric structures into a semiconductor substrate is performed by exposing the semiconductor substrate to a hydrogen gas mixture for a first time at a first temperature after implanting ions through the conductive and dielectric structures of the semiconductor substrate. The conductive and dielectric structures may include high-K dielectric structures that include at least one of hafnium oxide ($HfO_2$), hafnium silicon oxide ($HfSiO_2$), hafnium silicate ($HfSiO_4$), tantalum oxide ($TaO_5$), tungsten oxide ($WO_3$), cerium oxide ($CeO_2$), titanium oxide ($TiO_2$), yttrium oxide ($Y_2O_3$), strontium titanate ($SrTiO_3$), lanthanum aluminate ($LaAlO_3$), niobium pentoxide ($NiO_5$), zirconium silicate ($ZrSiO_4$) and zirconium oxide ($ZrO_2$).

The hydrogen gas mixture may have at least 1% hydrogen gas and a remainder of one or more inert gas, such as a forming gas. The exposure time may be at least 30 minutes, and the first temperature may be, for example, from 300 C to 500 C or from 350 C to 450 C. In an embodiment, the first time is from one half hour to five hours and the first temperature is from 350 C to 450 C.

In an embodiment, the dielectric structures may include at least one dielectric material with a K of 20 or more, the first temperature is from 300 C to 500 C, the hydrogen gas mixture includes at least 1% hydrogen, and the temperature is at least 30 minutes, and the ions are implanted to form a cleave plane below the circuit layer.

A method of forming a device includes providing a first substrate, depositing a thickness of range compensating material on a first surface of the first substrate, implanting ions into the first substrate, the ions traveling through the range compensating material to define a cleave profile in the first substrate, the cleave profile including at least one contour that corresponds to the thickness of absorber material, removing the absorber material, and cleaving the first substrate at the cleave profile, thereby exposing the at least one contour. In an embodiment, at least one contour is a coolant channel. The range compensating material may be a photoresist material.

The method of forming a device may include, after cleaving the first substrate, coating exposed surfaces of the coolant channel with a coating layer. The coating material may be a material that prevents a chemical reaction between a coolant fluid and the first substrate material. For example, the coating material may be a nitride material or an oxide material. The thermal conductivity of the coating material may be higher than a thermal conductivity of a bulk material of the first substrate. In some embodiments, the first substrate has a thermal conductivity that is greater than 130 W/m-K at a temperature of 25 degrees Celsius. The first substrate may include carbon, for example in embodiments in which the first substrate is a diamond or graphite material.

After cleaving, the cleaved surface of the first substrate may be bonded to a second substrate having a circuit layer. In such an embodiment, the bond may be formed by an oxide layer deposited on a surface of the second substrate. When the range compensating layer is removed, a bond layer may be deposited on the first surface of the first substrate, and used to bond a third substrate comprising a circuit layer to the bonding layer on the first surface of the first substrate. The first, second and third substrates may be wafer scale substrates.

In some embodiments, hydrogen ions are implanted through one or more circuit layers that includes high-K dielectric and conductive elements. In such embodiments, ion implantation may damage the dielectric and conductive elements. The damage may be repaired by exposing the substrate to an atmosphere that includes a hydrogen gas and an inert gas at a temperature of from 350 degrees Celsius to 500 degrees Celsius for at least 30 minutes to repair damage to the dielectric structures.

In an embodiment, a method for forming a stacked semiconductor device includes implanting ions through dielectric and conductive structures of a first substrate to define a cleave plane in the first substrate, cleaving the first substrate at the cleave plane to obtain a cleaved layer including the dielectric and conductive structures, bonding at least one die to the first substrate, the at least one die having a smaller width than a width of the first substrate, depositing a planarization material over the at least one die, planarizing the planarization material to form a planarized upper surface over the at least one die, and stacking a third substrate on the planarized upper surface.

The ions may be implanted at a temperature of 100 degrees Celsius or less. In an embodiment the ions are implanted at room temperature.

In some embodiments, a total thickness variation (TTV) of material cleaved from the substrate is 4% or less, 2% or less, or 1% or less. The first, second and third substrates may be wafer scale substrates. Furthermore, after cleaving the first substrate, the first substrate may be annealed to repair damage to the dielectric and conductive structures caused by the ions.

In an embodiment, an annealing process that repairs damage to the dielectric and conductive structures is performed at a temperature of 350 Celsius or greater in an environment that includes hydrogen gas. Conditions in a repair process should be sufficient to allow hydrogen to penetrate the device surface and bond to a molecule that was damaged by an implantation process. In one specific embodiment, the repair annealing is conducted at a temperature of 400 Celsius in an atmosphere that includes from 2 to 4 percent hydrogen, with a remainder being one or more inert gas. In an embodiment, the repair annealing is conducted for a period of time that is sufficient to allow the hydrogen gas to diffuse though circuit structures in a device, which may include an interconnect network of metal and low-dielectric constant dielectric material, and to occupy passivating sites at damaged dielectric bonds. In an embodiment, annealing is conducted at a temperature of 400 Celsius for one hour.

An embodiment may include depositing a dielectric material over the at least one die after bonding the at least one die to the first substrate and before bonding the third substrate over the at least one die. Before implanting the ions, a range compensating layer may be formed over the first substrate.

After the first substrate is cleaved, the first substrate may be bonded to a second substrate. In an embodiment, the second substrate has second dielectric and conductive structures, and the second substrate is formed by implanting ions through the second dielectric and conductive structures. The first, second and third substrates may be wafers.

A small die may be one of several types of devices, including an amplifier, a RF tuner, a radio tuner, a Light Emitting Diode, and an optical sensor.

The plurality of conductive structures may be a plurality of transistors with a respective plurality of conductive gates that are separated from respective channel regions by gate dielectrics.

In an embodiment, a method of forming a three-dimensional integrated circuit includes providing a first semiconductor substrate with a first circuit layer including conductive metal and dielectric materials, implanting ions through the plurality of conductive metal and dielectric materials of the first circuit layer to create a first cleave plane in the first substrate, cleaving the first substrate at the first cleave plane, providing a second semiconductor substrate with a second circuit layer including conductive metal and dielectric materials, implanting ions through the conductive metal and dielectric materials of the second circuit layer to create a second cleave plane in the second substrate, cleaving the second substrate at the second cleave plane, bonding the first substrate to the second substrate, stacking at least one die on the second substrate, the die having a width that is less than a width of the first plurality of circuit structures, depositing a planarization material over the at least one die, planarizing the planarization material to form a planarized upper surface over the at least one die, and stacking a third substrate on the planarized upper surface.

In an embodiment, a method of forming a semiconductor device includes forming an ion range compensating layer over a surface of a first substrate, implanting ions through the ion range compensating layer and dielectric and conductive structures of the first substrate to define a cleave plane in the first substrate, cleaving the first substrate at the cleave plane to obtain a cleaved layer including the dielectric and conductive structures, bonding at least one die to the first substrate, at least one die having a smaller width than a width of the first substrate, depositing a planarization material over the at least one die, planarizing the planarization material to form a planarized upper surface over the at least one die, and stacking a third substrate on the planarized upper surface.

According to the present disclosure, techniques generally related to the manufacture of integrated circuit devices are provided. More particularly, the present disclosure provides a method and resulting devices for stacking and interconnecting three-dimensional (3-D) devices using heterogeneous and non-uniform layers, such as fully fabricated integrated circuits. By way of example, the integrated circuits can include, among others, memory devices, processor devices, application specific devices, controller devices, communication devices, and others.

A method comprises providing a first substrate having dielectric structures and conductive structures. Ions are implanted into the first substrate, the ions traveling through the dielectric structures and the conductive structures to define a cleave plane in the first substrate. The first substrate is cleaved at the cleave plane to obtain a cleaved layer having the dielectric structure and the conductive structures. The cleaved layer is used to form a three-dimensional integrated circuit device having a plurality of stacked integrated circuit (IC) layers, the cleaved layer being one of the stacked IC layers.

Three-dimensional stacking and interconnection of heterogeneous and non-uniform layers, such as fully fabricated integrated circuits are provided. Techniques are included for a substantial reduction in inter-layer separation and increase in the available inter-layer connection density, leading to increased signal bandwidth and system functionality, compared to existing chip stacking methods using interposers and through-Silicon vias (TSVs). The present techniques extend the use of high-energy proton implants for splitting and layer transfer developed for homogeneous materials, such as the fabrication of Silicon-on-Insulator (SOI) wafers, with modifications appropriate for layer transfer of heterogeneous layers and consideration for damage effects in device structures.

In an example, the plurality of transistor devices are selected from at least one of CMOS devices, bipolar transistors, logic devices, memory devices, digital signal processing devices, analog devices, light absorbing and imaging devices, photo-voltaic cells or micro-electrical mechanical structures (MEMS), or any combination thereof.

The present disclosure achieves these benefits and others in the context of known process technology. However, a further understanding of the nature and advantages of the present disclosure may be realized by reference to the latter portions of the specification and attached drawings.

BRIEF DESCRIPTION OF THE DRAWINGS

FIG. 10 shows an embodiment of a process for forming an interconnect network layer and bonding the interconnect layer to a 3DIC stack.

FIG. 11A shows an embodiment of an interconnection network layer that is formed on a semiconductor substrate.

FIG. 11B shows particles being implanted through the conductive and dielectric structures of the interconnection network layer to form a cleave plane in the semiconductor substrate.

DETAILED DESCRIPTION OF THE SPECIFIC EXAMPLES

Figure 1:
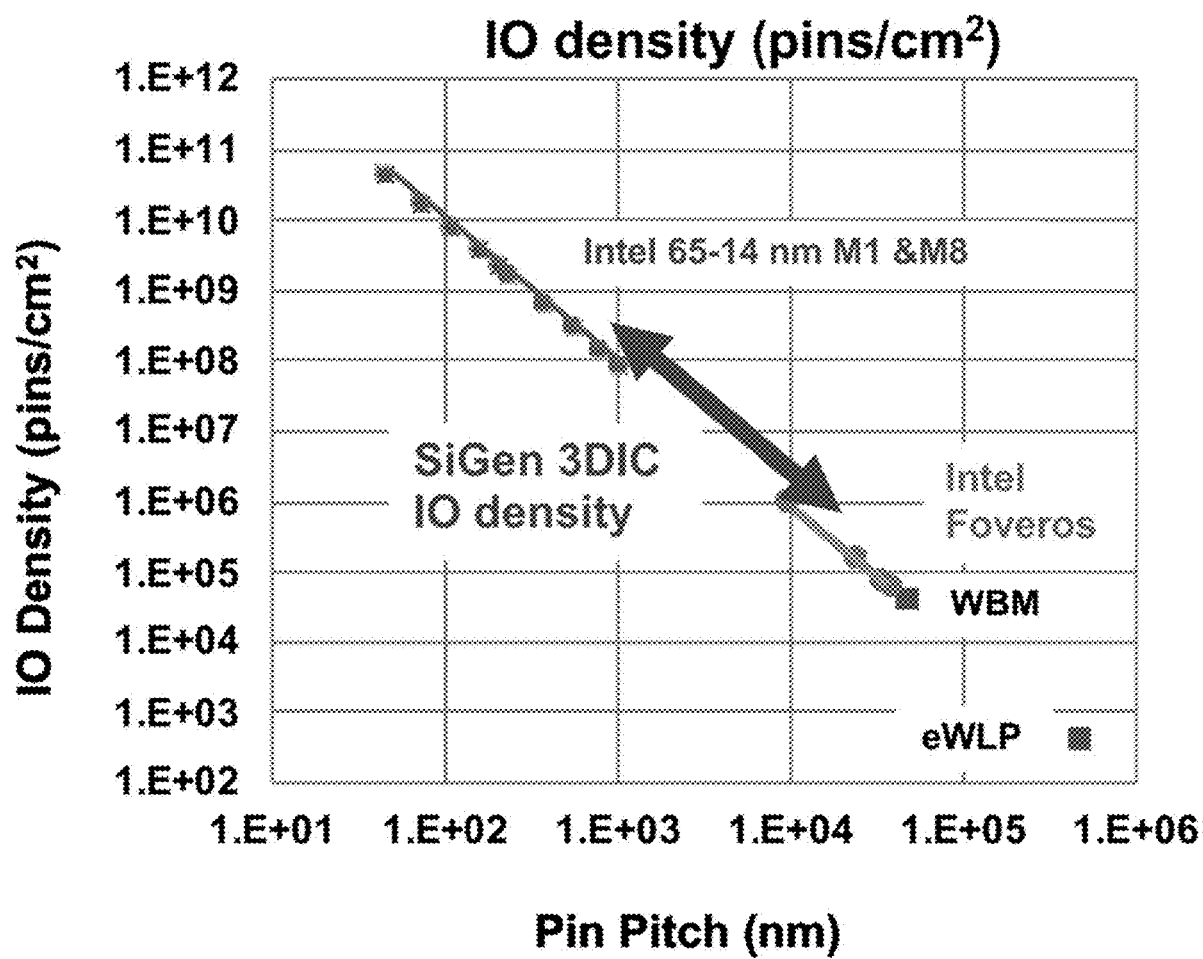
FIG. 1 illustrates reported pin (via) pitch for interposer/TSV packages (eWLP), an example of a family of 2.5-3D multi-chip packaging (Intel Foveros) as well as transistor contact (Metal 1) and top high-density metal (Metal 8) metal for Intel microprocessor chips for 65 to 14 nm generations. Also shown ("SiGen 3DIC IO density") is the expected range of available pin pitch and corresponding pin density for 3DIC stacked chips. The expected increase beyond 2.5D packaging methods in vertical, inter-device layer bandwidth is in the range of 10 to 100×, constrained mainly by the requirements for accurate inter-layer alignment of contact pads for signal and power distribution with high density and small feature size interconnects for bonding of wafer and die-scale device layers into 3DIC systems.

According to the present disclosure, techniques generally related to the manufacture of integrated circuit devices are provided. More particularly, the present disclosure provides a method and resulting devices for stacking and interconnecting three-dimensional (3-D) devices using heterogeneous and non-uniform layers, such as fully fabricated integrated circuits. By way of example, the integrated circuits can include, among others, memory devices, processor devices, image sensing devices, digital signal processing devices, application specific devices, controller devices, communication devices, and others.

An embodiment builds and extends the capabilities of two large areas of technology, layer transfer methods for formation of bonded stacks of homogeneous layers, such as the formation of Silicon-on-Insulator (SOI) wafers and diverse methods in present use and development to form 3-D stacks of electrical devices using one or more interconnect layers that are formed by a layer transfer process.

An embodiment provides for methods of stacking and interconnection of diverse electrical and/or electro-mechanical layers with one or more lateral interconnect layer. Further details of the present disclosure can be found throughout the present specification and more particularly below.

Embodiments may combine Silicon-On-Insulator (SOI) wafer formation approaches utilizing techniques such as H-cut separation and plasma-activated bonding to achieve a room temperature transfer process, combined with Si separation utilizing MeV proton technology, to achieve full-CMOS 3D stacking.

Such Layer-Transfer (LT) applied to 3D Wafer-Scale Packaging (WSP) can allow substantial benefits due to its high parallel connectivity and ability to use different processes. Embedded RAM/Cache layers are a natural application.

Conventional wafer-scale packaging (WSP) approaches may experience challenges in one or more of the various areas of: bonding, layer alignment, layer thinning, and layer strata interconnect. For example, layer thinning to less than 10 μm can desirably lead to vias with smaller aspect ratios and higher interconnect densities.

Embodiments utilizing layer transfer (LT) technology involving cold processing, allow processing of wafers with Interlayer Dielectric (ILD)/metal interconnects. An atomic bond, which may be a plasma-activated fusion bond or a thermal compression bond, may confer bond strength and ultra-thin bonds without glue layers.

Embodiments may be compatible with a variety of IC processes, including those used to fabricate complementary metal oxide semiconductor (CMOS) and Random Access Memory (RAM) devices, etc.

The use of implantation of up to MeV energies allows thicker implantation through an entire device layer (10 μm). Thus, a full CMOS device layer can be transferred instead of partial layers.

Implant scanning techniques may be used. Examples can include obtaining improvements in control of channeling effects through "dithering".

Utilization of MeV protons by embodiments for full CMOS stacking, may offer certain benefits. Embodiments may allow avoidance of shadowing due to CMOS layers that include transistor, dielectric, and/or metal layer structures.

A 1 MeV proton beam is sufficient to perform H-cut implants through 8 Cu metal interconnect layers and a full-depth CMOS microprocessor unit (MPU) with ≈10 μm Si penetration.

Such a 10 μm depth in Si, for a 1 MeV proton beam through a model 8-layer Cu interconnect array and connected CMOS transistor layer, is adequate for separation of damage peak from CMOS device region. A figure of merit for the desired minimum separation below the CMOS transistor layer of the proton damage region and bond oxide surface of the transferred layer substrate layer is the depletion depth into the substrate material of a biased, powered on, bulk CMOS array, on the order of 1 micrometer for a 1 V supply voltage and a 10 Ohm-cm substrate material. CMOS transistor layers comprising bulk "finFET" and "fully-depleted SOI" devices can have somewhat thinner substrate depletion thickness, depending on the device design and supply voltage. Relative precision (straggling/range) of 1 MeV proton profiles is much sharper than standard SOI wafer fabrication implants (at ≈40 keV).

It is further noted that H peak depth can be reduced by spin-on resist absorber layers. This aspect is further described in U.S. Pat. No. 10,573,627, which is incorporated herein by reference.

Embodiments may also provide proton implants useful for separation and layer transfer stacking of highly sensitive CMOS device structures. As previously mentioned, embodiments utilize high-energy proton implants to form a Hydrogen-rich cleave surface several microns below the combined thickness and stopping power effects of a combination of top layers of photo-resist or CVD dielectrics, and a multi-layer metal interconnect network and transistor layers.

Radiation damage effects arising from the passage of a high-dose, high-energy proton beam through the metal interconnect and transistor layers, may be at manageable levels—recoverable by standard annealing cycles at modest temperatures. Moreover, where specific radiation damage effects are of particular concern, embodiments can include an implementation that bypasses concerns for radiation damage effects in device dielectric layers.

One issue relating to possible radiation damage during high-dose, high-energy proton implants into CMOS device layers and their associated metal interconnect network layers, is bond-breaking effects in various dielectric layers. This can be due to electronic stopping events from the passage of the energetic proton beam or from UV-radiation from ion-electron relaxation following recombination event in the accelerator beam line.

When the high-dose, high-energy proton implantation is performed at specific points during the CMOS device fabrication process, radiation effects from the proton beam can be substantially avoided. One point in the CMOS process can be identified as occurring after the high temperature (e.g., greater than 500° C.) processes associated with activation of dopants in CMOS junctions are completed, and before the deposition of sensitive gate stack oxides and subsequent incorporation of inter-layer dielectrics in the metal interconnect network.

At such a point in the CMOS fabrication process, the principal material in the device wafer is crystalline silicon in doped junctions, with poly-silicon filled lateral isolation regions, and the substrate wafer. The only substantial, long-term radiation damage effects in predominantly silicon material are associated with lattice damage arising from the nuclear stopping components of the proton slowing down process.

Lattice damage events for a high-energy proton beam may be localized near the peak of the proton profile. According to embodiments, that peak may be placed several microns below the CMOS junctions in the transistor layer and provide key hydrogen-trapping sites for localization of the cleave surface during layer separation. The several micron separation between the CMOS transistor layer and its associated carrier depletion layers and the proton-induced lattice damage in the region of the subsequent layer separation, may be sufficient to avoid risk for deleterious device effects from the proton lattice damage layer.

Utilization of methods and apparatuses according to embodiments may permit modulation of inter-layer bandwidth by stacking order and inter-layer thickness. Specifically, a principal goal of 3DIC stacking is to provide an alternative path for increasing the bandwidth for signal processing communications between devices.

Bandwidth is the product of the data signal frequency, often approximated by the CPU clock frequency, and the number of external communication channels. For much of its history, IC development has focused on increasing the CPU and other data processing chip cycle frequencies, possibly at the cost of increasing chip power use. The number of communication channels has been limited by the density of bond pads available along the periphery of a planar device.

The development of 3DIC stacking methods has increased the possible number of vertical channels, measured by the density inter-layer communication lines. This density of inter-layer communication channels increases as vertical connection channel density increases. A convenient measure of the density of inter-layer connections is the inverse square of the communication pin separation or "pitch". Specifically, IO density=1/(pin pitch).

The minimum metal channel or "pin" pitch, depends on a variety of process and device considerations. One factor is the aspect ratio (AR) of the inter-layer metal channels: the ratio of the metal line diameter to the length of the via hole to be filled. Conventional "Through Silicon Via" (TSV) structures may typically exhibit an AR of between about 5 to 20. This is significantly higher than the typical design rules for vias in high-density metallization for IC devices—often with an AR of less than 2.

One device consideration affecting the packing density of conventional TSV structures, is the inter-device stress arising from the different thermal expansion of micrometer-scale Cu cylinders and Si device materials. The undesirable local stress in the immediate surroundings of a Cu via line can lead to design rules defining micrometer-scale "keep out" zones, where active circuit element are excluded from the vicinity of Cu via landing pads. This affects circuit density, performance, and yield.

Accordingly, methods and apparatus of specific embodiments may provide one or more procedures to locally increase the inter-level metal channel density and corresponding communication bandwidth between adjacent device layers. Use of high-energy, high-dose proton implants through a substantially completed metal interconnect network and fully formed CMOS transistor layer for formation of a Hydrogen-rich region for non-thermal layer separation and bonding onto a 3DIC stack, provides an inter-layer separation of a few micrometers (or less, for the cases of device layers on SOI buried oxides or other device types with minimal carrier depletion layer thicknesses). This allows substantially less inter-layer separation than the tens of micrometers typical of present day TSV and interposer stacking methods. The thinner inter-device Si layers and elimination interposer and associated adhesive layers provide by embodiments allows for fabrication shorter and thinner inter-device metal signal connections and greatly reduces the "dead zone" effects arising from thermal stress of several microns thick Cu TSV channels.

Specific examples of 3DIC structures according to embodiments may be characterized by an IO density (in Pins/cm2) of between about 1.0E+06-1.0E+08, over a pin pitch range (in nm) of 1.E+03-1.E+04. In an example, for a TSV depth of 1 µm, aspect ratios (depth:minimum width of diameter) may range from between 10 to 1 over a range of TSV diameters from about 0.1 to 1 µm.

Proton implantation to form a 3DIC structure according to embodiments, may take place at energies of about 1 MeV, including energies of between about 200 keV-5 MeV, about 500 keV-3 MeV, about 700 keV-2 MeV, or about 800 keV-1 MeV. Proton beam energies are discussed in U.S. Patent Publ. No. 2008/0206962, which is incorporated by reference herein.

3DIC structures are commonly stacked at the wafer level. Wafer-level processing, especially when combined with the directness of the transfer methods for fully-metallized CMOS devices described herein, has substantial advantages for economic and efficient processing.

Wafer-level processing of bonded structures typically assumes that the same size wafers are used, and the placement of dies on the joined wafers are closely coordinated to result in vertical stacked 3DIC structures after separation into discrete systems. These conditions are commonly met for large-area logic and memory devices fabricated on 200 or 300 mm Si wafers in mass-production foundry processing.

Many desirable components for communication linkage, such as RF tuners, amplifiers and the like, are considerably smaller in die size than $cm^2$-sized logic and memory devices. These smaller die sized devices may be fabricated on diverse wafer sizes such as 100 and 150 mm, and may use non-bulk silicon substrates such as Radio-Frequency Silicon on Insulator (RF-SOI), GaAs, etc.

There are many challenges associated with stacked structures with diverse die sizes. Device alignment is important, and can be complicated by the thickness variation inherent to backgrinding processes used to thin dies. Total Thickness Variation (TTV) for backgrinding processes are typically in the range of about 5%. Such variation can compound when multiple layers are stacked, making it difficult to perform semiconductor forming processes to facilitate interlayer connection. As a result, stacked devices employ relatively large solder bumps and interposer layers to connect devices in a vertical stack. In addition, many devices use bonding wires to connect multiple layers that are disposed side-by-side in a package.

Embodiments of the present disclosure include devices and processes for 3DIC structures that include heterogeneous die sizes. Dies that are formed by performing ion implantation through circuit structures including dielectric and conductive materials to cleave base substrates simplify the thinning process, and have less variation than backgrinding processes. TTV values that can be obtained by ionic cleaving may be, for example, less than 2%, less than 1.5%, and less than 1.0%. In addition, backgrinding applies a substantial amount of mechanical stress to semiconductor devices, which may disrupt structures in the device, causing further alignment and performance issues.

A key benchmark for IC devices is the net information processing and exchange rates expressed in terms of various metrics for data bandwidth. Bandwidth BW for IC logic and memory devices can be expressed as the product:

$$BW(\text{Bandwidth}) = P(\text{parallelism}) * CF(\text{clock frequency}) * ID(\text{I/O density}). \quad [\text{Eq. 1}]$$

In which P (parallelism) reflects the degree of parallel processing in the device, expressed in the form of independent internal logic cores, separately addressable blocks of memory or multiplicity of processing units in, for example, a graphics or bit chain processor, CF (clock frequency) is the synchronous clock frequency, and ID (I/O density) reflects the density of input and output connections supplying and sending data from the IC device.

Since the overall degree of parallelism is typically defined at the initial stages of the design of the individual 3DIC components and the overall system architecture and the operating clock frequency can be changed only slowly, with constraints from power consumption, chip system heating and other factors, the input/output density is an area available for significant improvements in overall and internal system bandwidth in a 3DIC structure. An example references for the impact of 3DIC stacking on bandwidth is "A Density Metric for Semiconductor Technology", H.-S. Philip WoNG, Kerem Akarvadar, Dimitri Antoniadis, Jeffery Bokor, Chenming Hu, Tsu-Jae King-Liu, Subhasish Mitra, James D. Plummer, Sayeff Salahuddin, Proceedings of the IEEE, Vol. 108, No. 4, April 2020. pp 478-482.

In an embodiment of a 3DIC, the thickness controls and short scales provided by Hydrogen implanted Si layer transfer allows for the use of transferred layer thicknesses which are 5 to 10 times thinner than thicknesses that are easily achievable with grind and etch thinning. Correspondingly, the etch and metal fill operations for forming high-density vertical signal, power and ground connections can be made with thinner metal connection diameters and significantly smaller connection pitch values. Accordingly, the use of LT technology in 3DIC provides for less device area stress, higher signal connection density and higher inter-device internal bandwidth than can be achieved with conventional 2.5 packaging technologies.

FIG. 1 shows the vertical signal connection line separation (pin pitch) and corresponding signal connection densities for a variety of 3D chip stacking technologies compared to the on-chip connections densities in a multi-level metal network for a microprocessor device and the range of signal interconnect densities achievable with the layer transfer technologies that may be used in embodiments of the present disclosure.

Conventional fabrication of signal Re-Distribution Layers, called RDL or interposers, uses specialized lithography and other fabrication tools, which limits the number of available RDL interposer suppliers, creating supply chain issues for 2.5D packaging applications.

The processing capabilities for lithography, etching and metal fill operations used to form high-density vertical and lateral signal connection networks described in the present disclosure are similar to the tool sets used for fabrication of many varieties of modern metal interconnect layers in a single IC die, with the addition of tools for bonding and layer transfer functions. Accordingly, embodiments of the present application provide advantages in terms of reduced cost and time, and expanded options for production.

Figure 2:
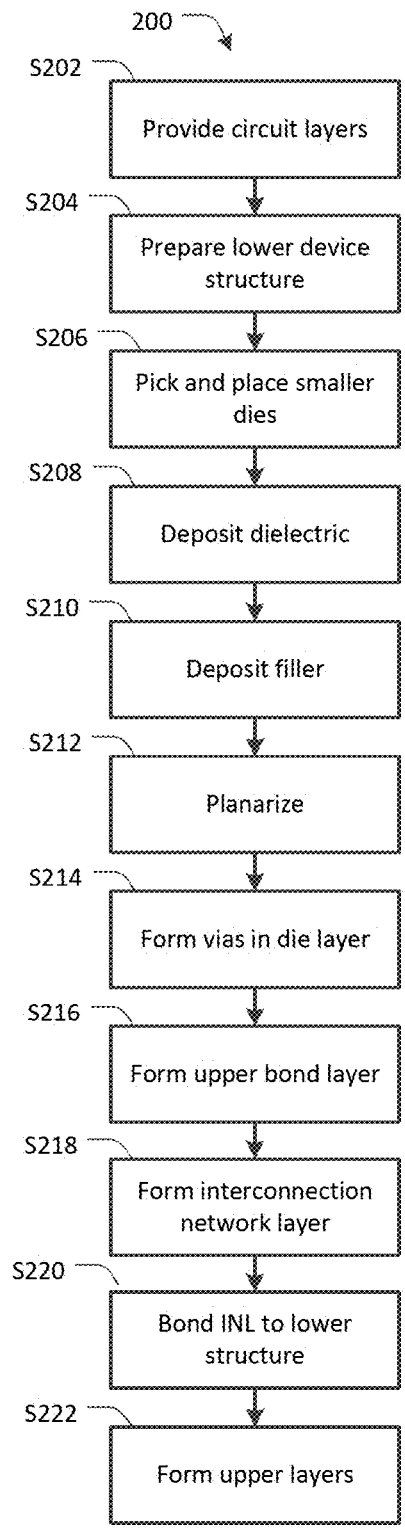
FIG. 2 illustrates an embodiment of a process for forming a 3DIC structure with an interconnect network layer.

FIG. 2 illustrates an embodiment of a process 200 for forming a 3DIC circuit. The process 200 is an example that is provided to assist in the understanding of innovations related to the present disclosure, and persons of skill in the art will recognize that many variations are possible. Although specific steps in this and other processes are presented in sequential order, in different embodiments, some of the steps may be practiced in a different order or omitted altogether.

Process 200 may include providing circuit layers such as circuit layer 102 at S202. Each circuit layer may be thinned, for example by using an LT thinning process, or may be provided in a thinned state. The circuit layers 102 may be wafer-scale circuit layers. In an embodiment, only one circuit layer 102 is provided at S202. The circuit layers 102 may be fabricated at a foundry and provided to a packaging facility performing process 200.

Figure 3:
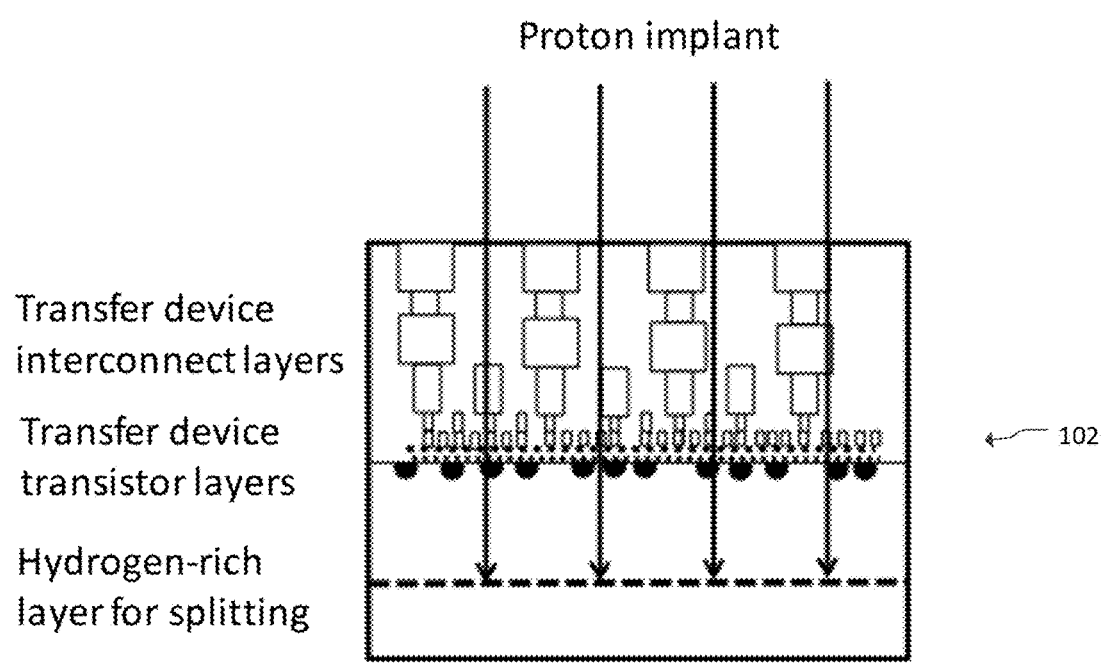
FIG. 3 illustrates an embodiment of implanting protons through a circuit layer of a semiconductor device.

A base device structure is prepared at S204. FIG. 3 illustrates an embodiment in which a base device structure 102 is prepared using high-energy hydrogen implantation, where the peak concentration of a high-dose hydrogen implant is located in the substrate region below a metallized layer which may be, for example, a CMOS or MEMS device layer. The base layer 102 may be a wafer-scale structure.

Figure 4:
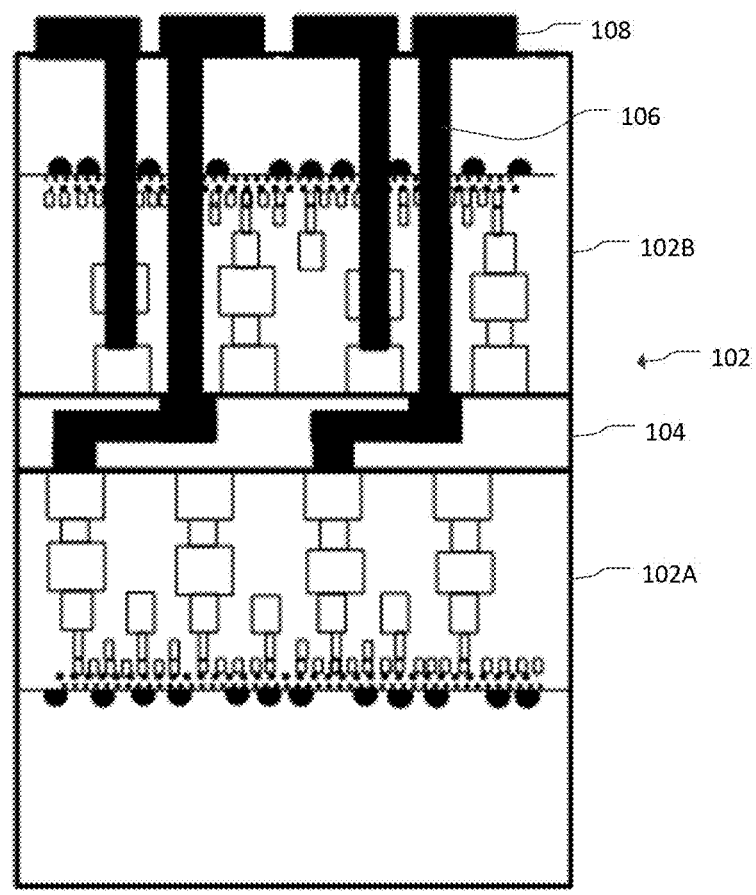
FIG. 4 illustrates an embodiment of two stacked wafer-level device layers with vertical vias extending from the top surface through the upper layer to the lower layer.

Following cleaving along an approximate location of the hydrogen concentration peak, residual damage along the cleave plane is removed and the transferred device layer is bonded to another wafer-scale device layer as shown in FIG. 4. In the embodiment shown in FIG. 4, the base device structure 102 includes two wafer-level bonded semiconductor layers, 102A and 102B, which are formed by implanting ions through dielectric and conductive structures that are formed on semiconductor wafers. In some embodiments, the base device structure 102 may include more than two stacked semiconductor layers or a single stacked semiconductor layer. In various embodiments, one or more device layer may be formed using LT technologies.

FIG. 4 illustrates wafer-level bonding in a device orientation where the bonding occurs along the metalized layers of the two layers, where the upper (second) device layer 102B is face down compared to the lower (first) device layer 102A, which is face up. Although only a single device of each of the first and second device layers are illustrated in FIG. 4, cleaving and bonding operations may be performed on a plurality of devices on a single wafer.

Before the two device layers 102A and 102B are bonded together, there is an opportunity for deposition and patterning of one or more intermediate layer 104, insulated by inter-metal dielectric materials, that can provide both vertical (device to device) and lateral connections for signal, timing, power and ground connections. Such inter-device metal connection layers 104 are analogous in function to redistribution layers (RDL) in modern 2.5 D multi-chip packaging schemes.

After bonding first device layer 102A to second device layer 102B, with inclusion of the intermediate connection layer 104, vertical vias 106 are etched and filled with metal to provide connections between the device layers and a top surface array of bond signal pads.

Bonding pads or electrodes 108 may be formed on the exposed upper surface of base device structure 102. Lower device structure 102 may include appropriate bonding pads 108 on the top layer of the base device structure 102 for direct pick and place addition of various smaller die components 110, as well as lateral wiring connections to interface between the contact pads exposed by the base device structure 102. The electrodes 108 may also serve as landing pads for vertical connections between the lower device layers 102A and 102B and upper device layers that are formed in subsequent steps.

In an embodiment, the top metal structures include multi-level metal networks for lateral communication, power and ground connections for a composite device, with the addition of bonding pad arrays designed for placement and bonding of face-down metal connections with smaller, diverse die types.

Figure 5:
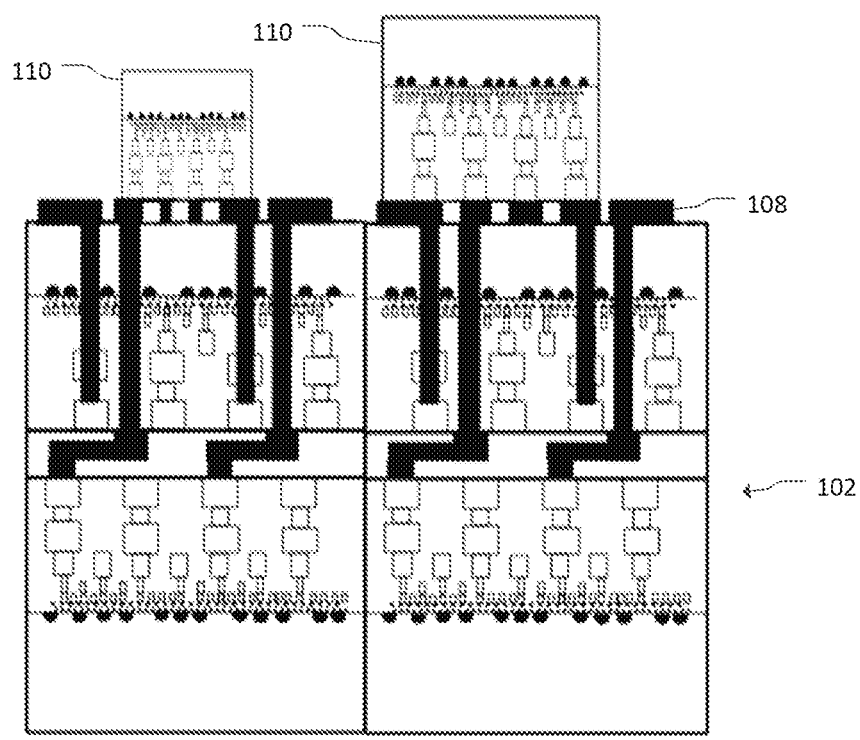
FIG. 5 illustrates an embodiment of two die-scale devices bonded to the embodiment of FIG. 3.

As illustrated in FIG. 5, one or more die 110 is placed on the electrodes 108 in process S206. The one or more smaller die 110 may be placed using known pick and place techniques to align terminals of the one or more smaller die 110 with the electrodes 108 exposed on the upper surface of the interconnect layer. The location and metal-to-metal bonding of discrete die types on a composite wafer-level bonded structure 102 can be accomplished by an automated die pick, place and bond apparatus.

Figure 6:
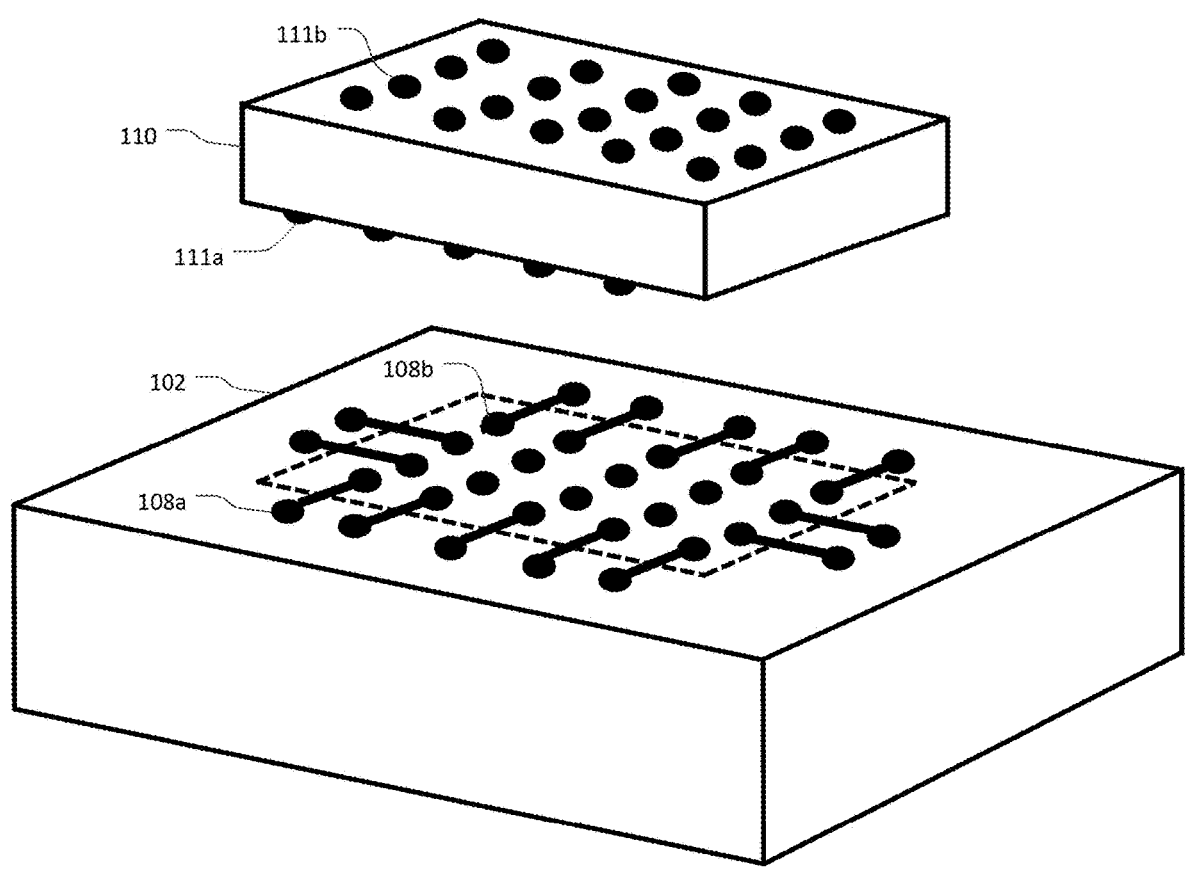
FIG. 6 illustrates external connection points for signal and power propagation connections on a die-scale device bonded into a 3DIC system structure, showing vertical connection pads on top and bottom surfaces of the die, and additional vertical connection pads connected by local bonds and lateral signal connections embedded in the local bond layer.

FIG. 6 illustrates an embodiment of a die-scale component 110 ready for placement onto bonding pads 108 of components in a lower 3DIC device layer 102. FIG. 6 illustrates a plurality of external connection points 111a/111b for signal and power propagation connections on a die-scale device 110 bonded into a 3DIC system structure. The placement area for the die 110 is indicated by a rectangle of broken lines. An advantage of placing dies on wafer-scale structures in process S206 is that it combines the economic advantages of wafer-level processing with the flexibility of incorporating layers of smaller area dies, which may be fabricated on a diverse variety of substrate materials and wafer sizes into composite 3DIC structures.

In the implementation shown in FIG. 6, a die-scale component 110 that is on a lower wafer-scale 3DIC stack 102 may have one or more features that facilitate 3DIC stacking. For example, the die 110 may include lower bond pads 111a which may be, for example, either mini-ball or hybrid (metal & oxide) bonding type, and the die 110 may further include internal connections and designed circuit elements to also connect to top-side bonding connection pads 111b to provide for additional vertical interconnection paths to upper 3DIC device layers. Additional vertical connection paths to the attached die-scale component can be achieved by fabricating vertical metal lines from the metal landing pads 108a along the near periphery of the die bonding location connecting to bonding pads 108b on the surface of the planarized bonding surface ready to connect to an additional wafer or die-level layer in the 3DIC stack.

In some embodiments, smaller dies 110 have different sizes and thicknesses from one another. The smaller dies 110 may be a heterogenous set of devices that perform different functions, or a homogenous set of devices.

Since dies 110 may have various thicknesses, a layer of deposited material 114 may be formed between and over the dies 110 at S208. In an embodiment, the deposited material 114 has a similar erosion rate under CMP processes as the substrates of the added smaller devices.

Figure 9:
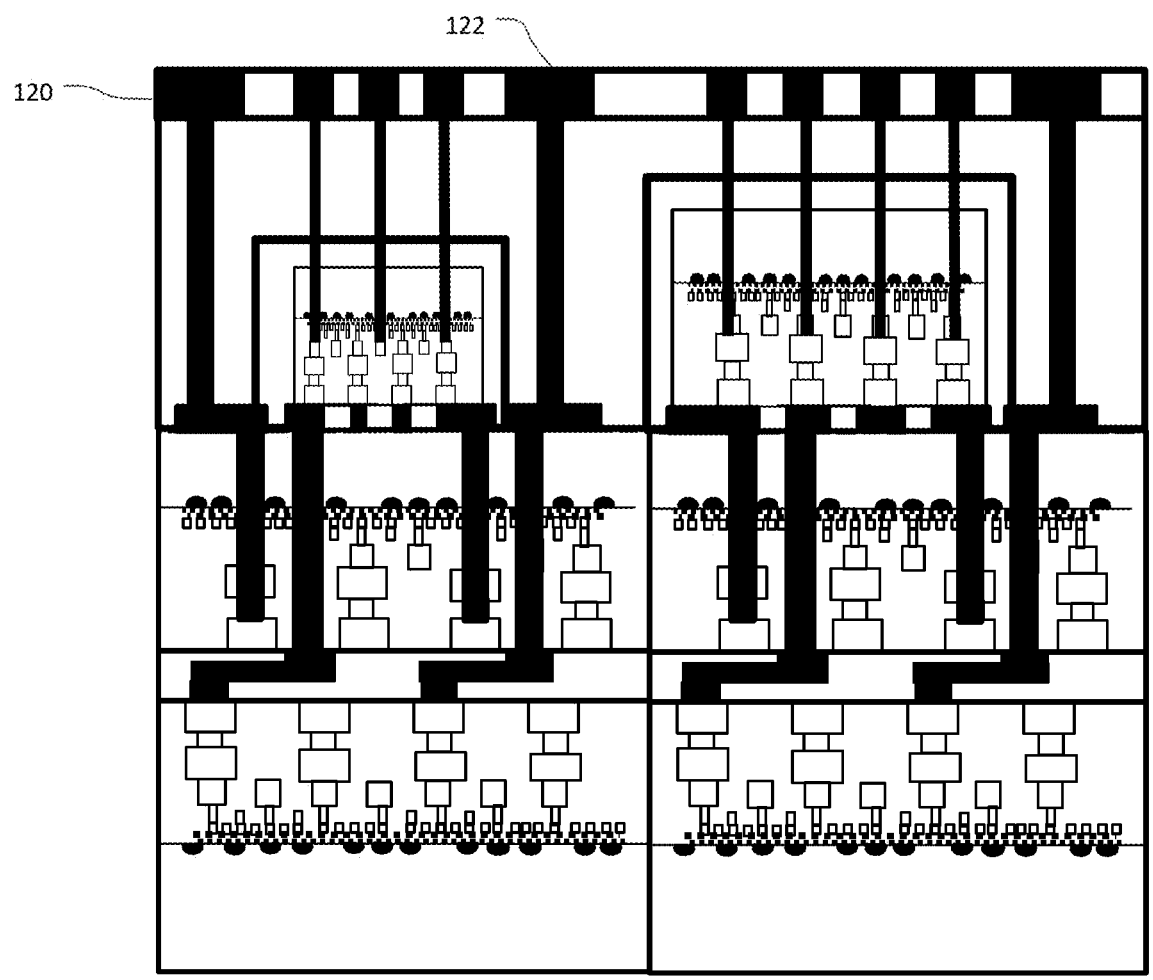
FIG. 9 shows the embodiment of FIG. 9 with an upper bond layer.

The local bandwidth within a 3DIC system structure can be substantially increased with a revised die design intended to take advantage of the increased opportunities for signal propagation connections arising from the non-planar, expanded dimensionality of the 3DIC architecture. A suggestive example of these design additions for increased signal and power connections is shown in FIG. 9, where the internal structures of die-scale devices are augmented to provide for external input/output (I/O) connections on the top as well as the more conventional bottom surface of the die. Additional connection opportunities are provided by connection landing pads near the periphery of the die-scale device, allowing for additional vertical connection paths and links to lateral networks in lateral signal connection layers.

Figure 7:
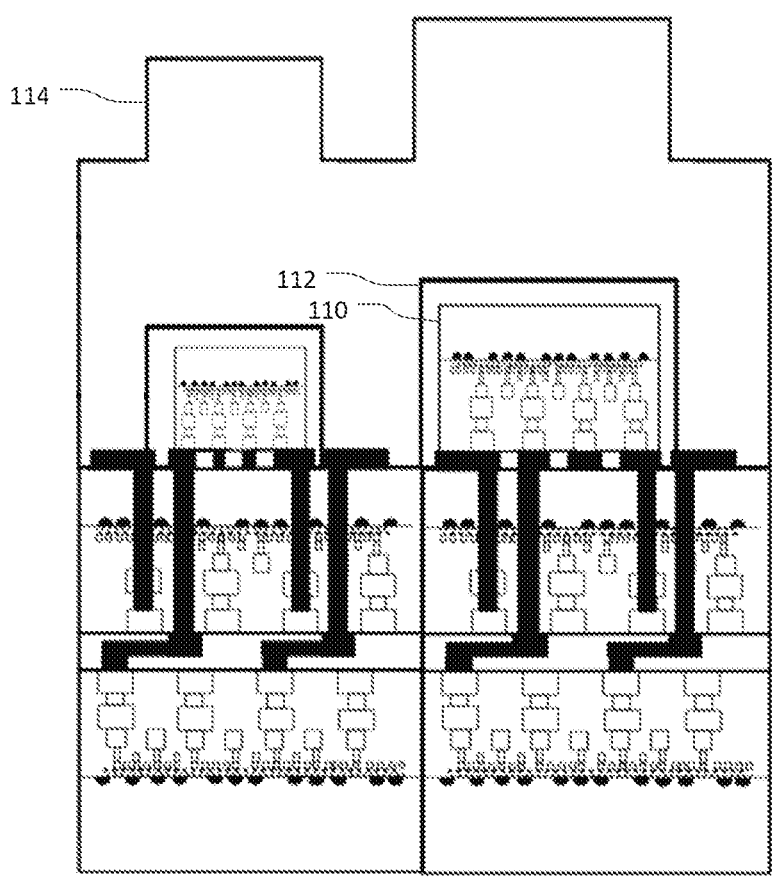
FIG. 7 shows an example of materials deposited over smaller die size devices bonded on a 3DIC.

For example, as seen in FIG. 7, dielectric material 112 may be deposited over exposed surfaces of the device structure including dies 110 in process S208. The dielectric material 112 provides for electrical isolation of the smaller dies 110. The dielectric material 112 may be one or more of a variety of materials commonly used in the semiconductor industry that provide insulation from stray current flows, including a CVD oxide or other suitable insulating material.

In some embodiments, a filler material 114 is deposited over the dielectric material 112 at S210. When the dies 110 are Si devices, the deposited layer may be plasma deposited poly-Si or amorphous-Si. The filler material 114 may be selected to have a similar erosion rate to the dielectric material 112 and the substrate material of the smaller die devices 110 when planarizing the structure at S212, for example by performing CMP.

Although process 200 and the associated figures describe forming a separate dielectric material 112 and filler material 114, in some embodiments only a single material or more than two materials are deposited over the dies 110.

A planarization process is performed at S212 to planarize the upper surface of the device. The slurry chemistry for the CMP process may be selected based on the dielectric material 112 and the filler material 114 to achieve approximately equal erosion rates of the substrates in the added smaller die structures 110 and the deposited over-layer materials. In an embodiment, planarization process S212 thins the added smaller die 110 substrates to thicknesses of about 10 µm or less for later formation of vertical metal vias for interconnection with later added structures and bonding pads. In an embodiment, planarization S212 is performed until in an overall layer thickness of 10 to 30 µm is obtained.

In addition, planarization process S212 provides a planar top surface for the newly enlarged composite device structure for subsequent addition of multi-level metal interconnects for lateral signal, power and ground connections as well as bonding pads designed for connections of additional layers added to the composite structure with wafer-level or discrete die placement methods. In an embodiment, the planarization process S212 may be performed on the top surface until the RMS surface roughness is 5 Angstroms or less, or 3 Angstroms or less.

The deposition and planarization elements of process 200 may be performed such that substrates of the smaller dies 110 are thinned to a desired thickness. In addition, the dielectric and filler materials 112 and 114 provide mechanical support, and in some embodiments one or more of the layers formed over dies 110 facilitate heat transfer out of a final 3DIC structure.

Figure 8:
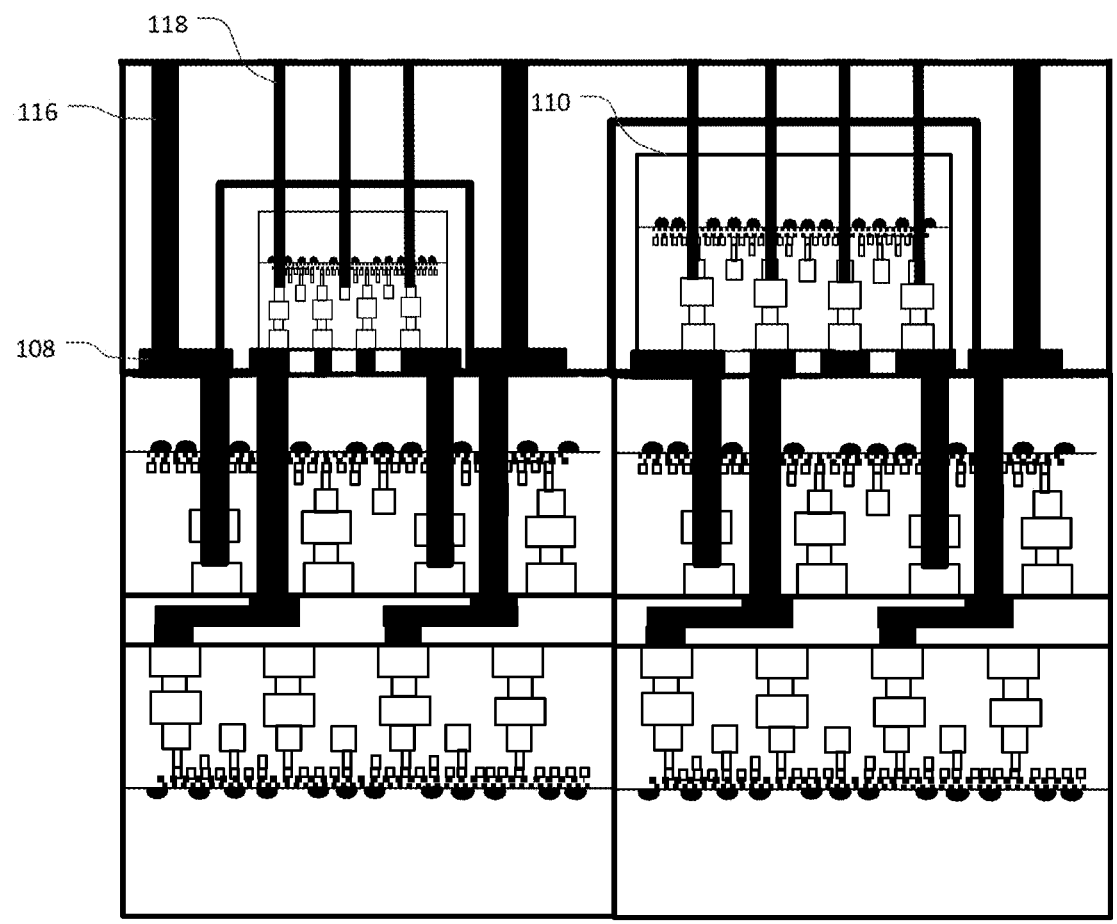
FIG. 8 shows an embodiment with increased signal connections for additional signal output pads coupled into a die and wafer level 3DIC stack.

After planarization, as seen in FIG. 8, a plurality of vertical vias 116 and 118 may be formed in the die layer at S214. The vias may include vertical vias 116 that extend between an upper surface of the filler material 114 and electrodes 108. In an embodiment, one or more vertical via 118 is formed to connect a die 110 to upper layer devices that are placed in subsequent steps. The vias 118 may be formed to contact electrodes of the die 110. The electrodes may be provided on an outer surface of the die, or within the die itself. When the electrodes are within the die 110, forming vias 118 may include etching openings that penetrate the die.

An upper bond layer 120 may be formed at S216. As seen in FIG. 9, the upper bond layer 120 may include contact pads or electrodes 122 that are formed of a metal material, with a dielectric material such as an oxide filling spaces between the electrodes 122. A final step of forming upper bond layer 120 may be a planarization process that is performed to prepare the exposed surface for an atomic bonding process. Atomic bonding uses intimate contact between bonded structures, so the planarization process may be performed to create a surface with a local roughness value (RMS) of less than a nanometer, or less than one half nanometer. Atomic bonding may be performed, for example, at a temperature of 250 to 350° C. for 2 to 3 hours under vacuum conditions while pressing the bonded materials together. In an embodiment, atomic bonding may use a plasma.

In basic terms, atomic level bonding is possible when the surfaces of the intended bond are close enough to each other to form atomic bonds. Accordingly, the two bonded surfaces should have sufficient flatness, over lateral scales of centimeters, without systematic surface height variations on the order of a small number of nanometers, so that the material in the surfaces are close enough to interact with one another on the atomic scale. Good atomic bonding is formed when roughness is low over lateral scales of a few microns.

In an embodiment, on a separate wafer, a multi-level interconnect network layer (INL) 130 with conductive metal interconnections for signal, power, timing synchronization and ground connections for the various local devices in the 3DIC stack, is fabricated on a Si wafer. The INL 130 may provide vertical and lateral connections extending beyond individual die areas, and may significantly increase the number of input/output metal channels for electrical connections for signals, DC power, circuit timing and ground. The result of an INL 130 is increased system bandwidth within a 3DIC system. In process 200, the INL 130 may be formed at S218.

FIG. 10 illustrates a process 1000 for forming an INL 130 that may be bonded to the structure shown in FIG. 9. A semiconductor substrate 120 is provided at S1002. The substrate 120 may be a silicon substrate. A first bond layer 124 is then formed on an upper surface of the substrate 120 at S1004. The first bond layer 124 may be formed using deposition and etching processes. For example, an oxide layer may be deposited on the surface of the semiconductor substrate 120 and selectively etched using photolithography to form openings in the oxide layer, and the openings may be filled with a metal material. In another embodiment, the upper surface of a substrate 120 is oxidized and etched, and conductive materials are formed in the etched openings.

A connection layer 126 is formed on the first bond layer 124 at S1006. The connection layer 126 may include multiple vertical and horizontal conductive structures that are interconnected with one another to distribute electrical signals between various layers in a 3DIC stack. The conductive interconnect structures may include horizontal pads that contact two or more vertical conductive lines to provide lateral distribution between layers. In an embodiment, the connection layer 126 distributes signals between multiple different dies 110 that are disposed on the same horizontal layer, and between devices that are disposed on different vertical layers.

The thickness of the overall interconnect structure, and in particular the Si layer base substrate, can be fabricated with thickness comparable to Si layers in routine SOI wafers, of the order of 0.5 um or less. This is far thinner than the thickness of interposer layers used in 2.5D packaging, which are on the order of 50 to 100 um, allowing for much smaller vertical TSV connections at much higher interconnect area density capable of much higher system bandwidth than conventional interposer structures. Thinner signal redistribution layers also increase 3DIC overall thermal conductivity, and may be combined with integral coolant fluid flow channels to further enhance thermal performance.

The interconnect structures of connection layer 126 may be formed using conventional semiconductor technologies. In an embodiment, pitch sizes of conductive structures are less constrained than pitch sizes of devices in the device layers, so the connection layers 126 can be formed by processes with reduced costs compared to the processes used for high-density fine pitched devices. A second bond layer 128 may be formed on the exposed surface of the connection layer 126 at S1008 using the same or similar techniques used to form first bond layer 124.

The interconnect layer wafer is implanted to a high-dose with a proton beam with energy sufficient to create a proton concentration sufficient to support layer cleaving with in the Si wafer at a distance below the interconnect layers at S1010. FIG. 11A illustrates a vertical and lateral interconnection multi-layer network 130 that provides, for example, one or more of signal, power, timing synchronization and ground connections for various local devices in the 3DIC stack. FIG. 11B shows particles being implanted to a high dose by an energetic proton bream sufficient to form a cleave plane 132 within the Silicon substrate of the interconnect substrate 120.

The accumulated damage formed at the peak of the implanted proton distribution serves as a trap for implanted Hydrogen atoms and hinders H-diffusion in following thermal processing associated with wafer bonding and the layer transfer cleaving process. The implantation may be performed by a low temperature process, e.g. a process that is performed at 100° C. or less, which may be a room temperature process. Higher temperature implantation process are known, but such processes could inhibit the formation of a stable damage layer by the proton stopping recoils, which provides a trapping layer to hold implanted Hydrogen in place along the cleave surface and could also damage or even destroy metal interconnect structures in the INL 130.

In an embodiment, the principal components of an INL 130 are conductive metal networks and dielectric layers with relatively low dielectric constants (low-k), which reduce RC (resistance and capacitance) delays for signal propagation within the interconnect network system and relatively minor amounts of Si substrate material.

The passage of energetic protons during the formation of buried proton and damage layers results in relatively weak interactions with metal and Si layers. However, the low-k dielectric materials are affected by scattering of protons within the electrons in dielectric layers, the electric stopping power of protons being the principal slowing down mechanism of keV-range protons in solids. The passage of energetic protons through dielectric materials results in broken atomic bonds within the dielectric materials leading to trapped charges and various other forms of damage leading to shifts in local charges and threshold voltages in attached transistor devices.

The effects of broken bond damage in these low-k dielectric insulating materials can be reduced by a variety of process methods including those described in U.S. Pat. No. 10,573,627. As described by that patent, the use of Hydrogen containing ambient during post-implant annealing of dielectric structures which have been implanted with high-dose traversing protons for the layer transfer process may repair bonds that are broken by the implantation of protons.

Accordingly, a process of repairing damage from the implantation may be performed at S1012. In an embodiment, repairing the damage from implantation may include exposing the interconnect network layer to a gas comprising 1% or more of hydrogen and a remainder of inert gas such as nitrogen or argon. The repair process may be performed for at least 30 minutes at a temperature of from 300° C. to 500° C.

The exposed surface of second bond layer 128 is planarized at S1014. The planarization may be performed to prepare the surface for atomic bonding. In particular, as described above, the surface may be planarized until local RMS surface roughness is less than 0.5 nanometers.

Figure 12:
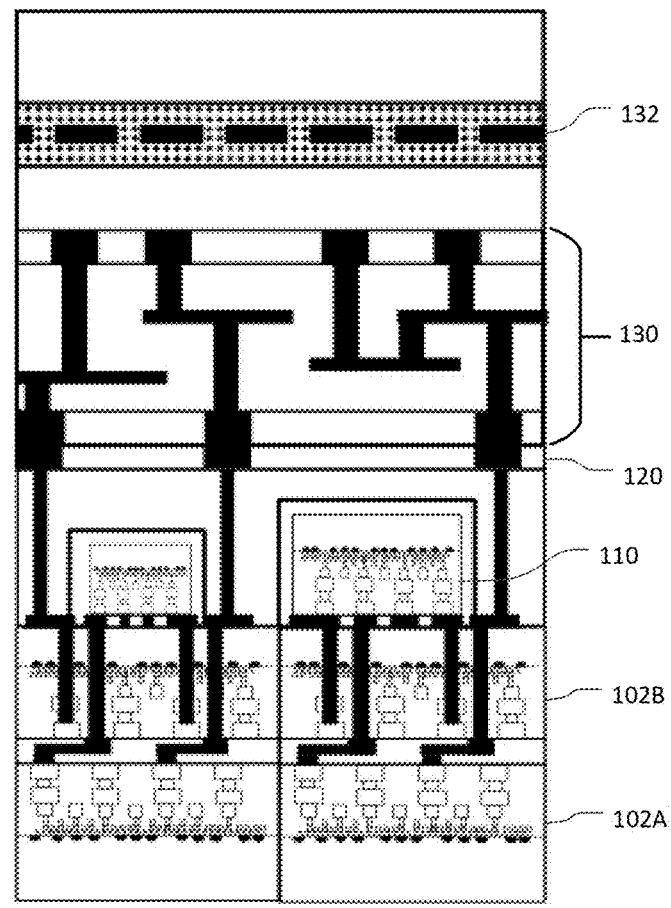
FIG. 12 shows an interconnection layer with a cleave plane that is bonded to a 3DIC stack.

The INL 130 is bonded to a lower device structure at S1016/S220. FIG. 12 illustrates bonding the proton implanted Si wafer with the INL 130 to a 3-layer 3DIC stack including two wafer-scale device layers 102A and 102B, and a layer of die-scale devices 110. INL 130 may be placed on the lower structure with an aligning bonder capable of matching up the locations of the metal bond pads on the interconnect layer and the top of the 3DIC stack. In an embodiment, the INL 130 may be atomic bonded to the lower structure using a combination of heat and pressure, commonly referred to as thermal-compression bonding (TCB), to form direct atomic bonds between the INL and the upper bond layer 120. In an embodiment, atomic bonding is performed using a plasma.

The bonded wafer stack is cleaved along the high Hydrogen concentration in the implanted Si wafer at S1018. In an embodiment, the cleave is performed by room temperature methods described by, for example, U.S. Pat. No. 8,241,996, the disclosure of which is incorporated herein by reference.

Figure 13:
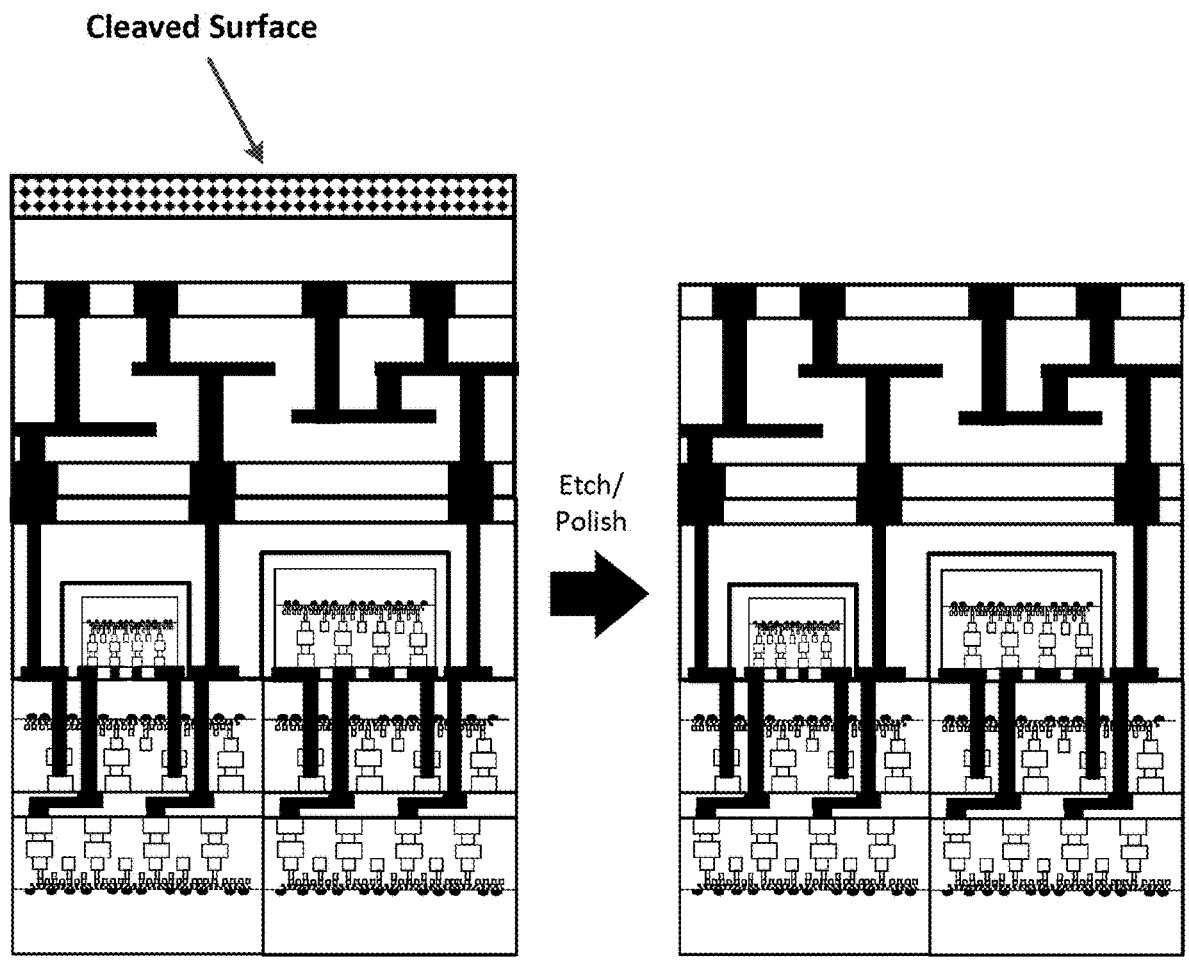
FIG. 13 shows the 3DIC stack of FIG. 12 after performing a cleave operation and removing semiconductor substrate material to expose contacts of the interconnection network layer.

FIG. 13 illustrates an embodiment of a 3DIC device after performing cleave operation S1018. The residual post-cleave Si damage and Si layer in the transferred layer can be removed at S1020, for example, by CMP and chemical etching processes, exposing metal pad surfaces connected to the upper layer of the INL 130 and the co-planar surface of a top surface dielectric, such as CVD deposited silicon dioxide, as seen on the right side of FIG. 13. The surface of the top of the INL 130 may be planarized for bonding of additional wafer-scale or die-scale device components. For example, the exposed surface of the INL 130 may be planarized by a CMP process to be sufficiently smooth and flat to be suitable as an atomic bonding layer.

Figure 14:
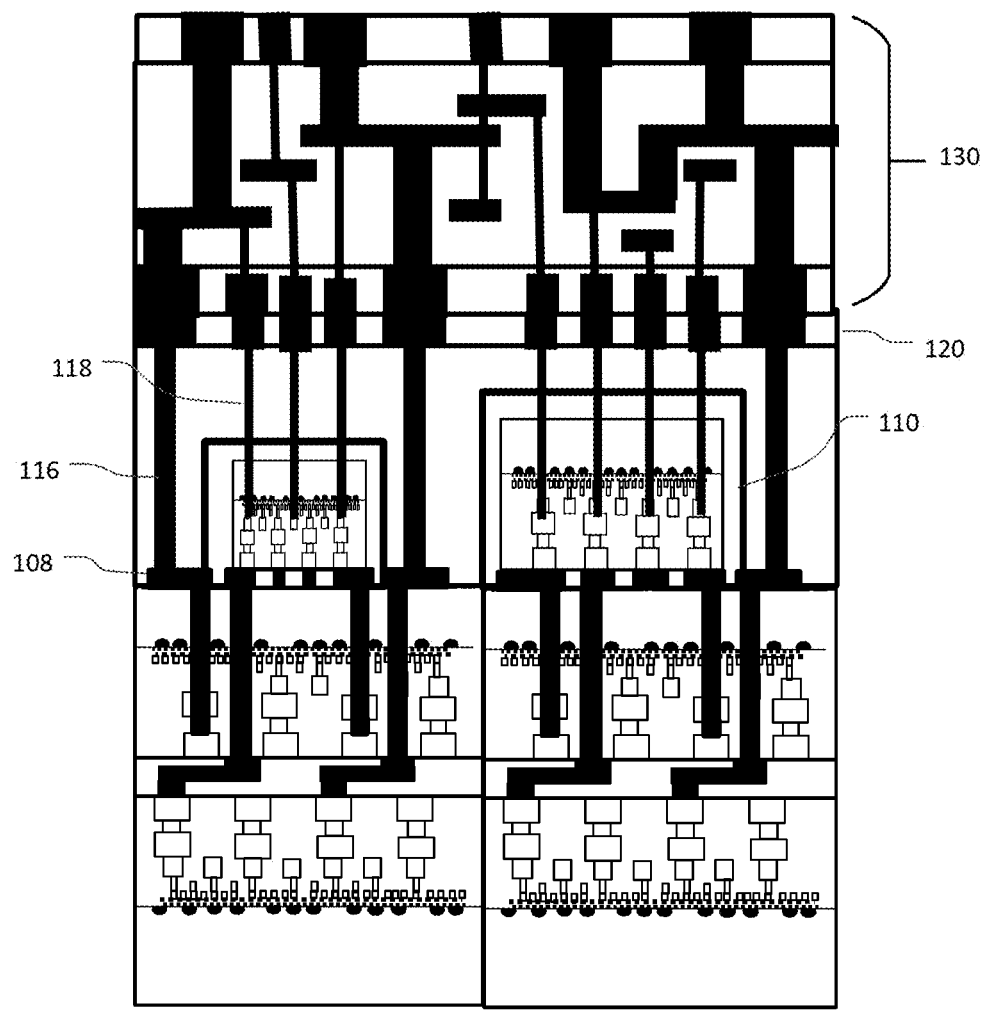
FIG. 14 illustrates a high-density interconnection network connected to vertical vias of a die layer and wafer-level structures beneath the die layer.

FIG. 14 illustrates another embodiment in which an INL 130 is bonded to a layer comprising dies 110 at S1016. In the embodiment of FIG. 14, vertical vias 118 extend from the dies to contacts in upper bond layer 120, and the contacts of layer 120 are bonded to corresponding contacts in an INL 130. Although the embodiment of FIG. 14 shows dies 110 that have different sizes, other embodiments are possible. For example, the dies 110 may have the same size, and/or vertical contacts 118 may only extend from a portion of the dies on the die layer. In other embodiments, a die layer may not be present, and the lower structure may have only wafer-level structures.

Additional layers are formed on the INL 130 at S222. In an embodiment, forming the additional layers includes providing one or more upper device layer 140 and bonding the one or more upper device layer 140 to the INL 130. In addition, forming the additional layers at S222 may include forming one or more adaptive interconnect layer 134 one or more upper device layer 140 to facilitate communication between the upper device layers and lower device layers through the INL 130.

Figure 15:
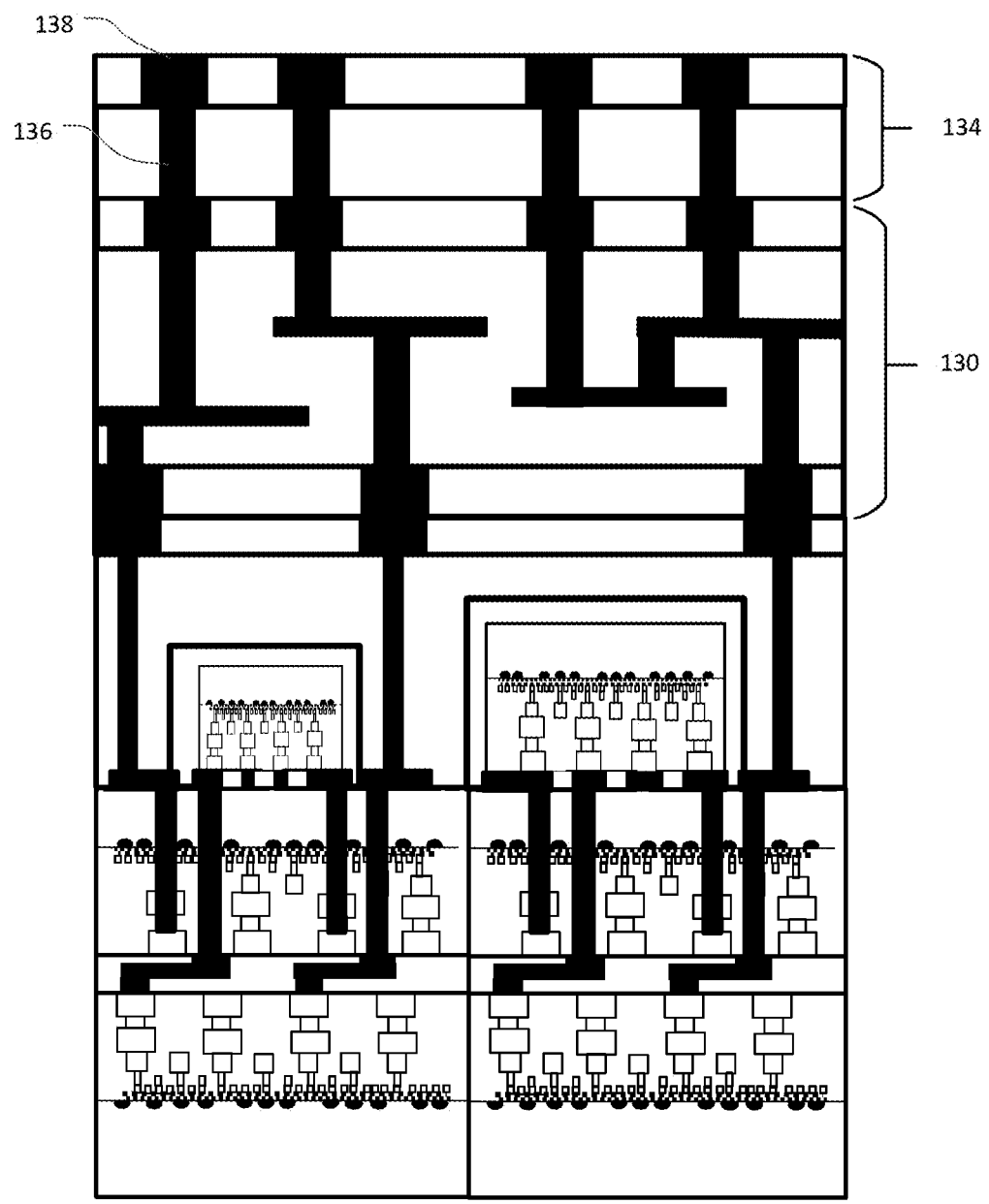
FIG. 15 shows the 3DIC stack of FIG. 14 with an upper connection layer.
Figure 16:
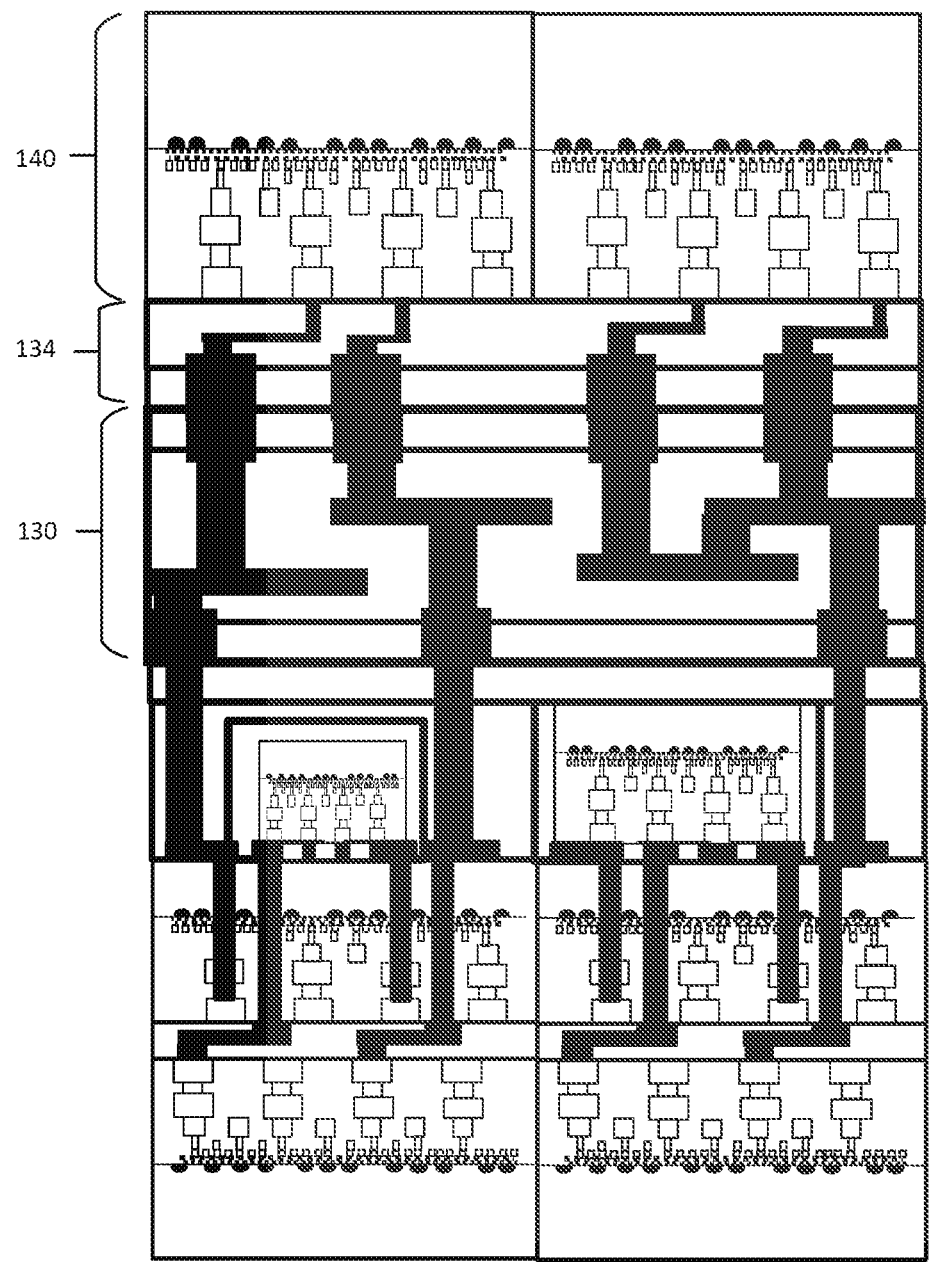
FIG. 16 shows a 3DIC stack with an upper wafer layer bonded face-down to an interconnect network layer.
Figure 17:
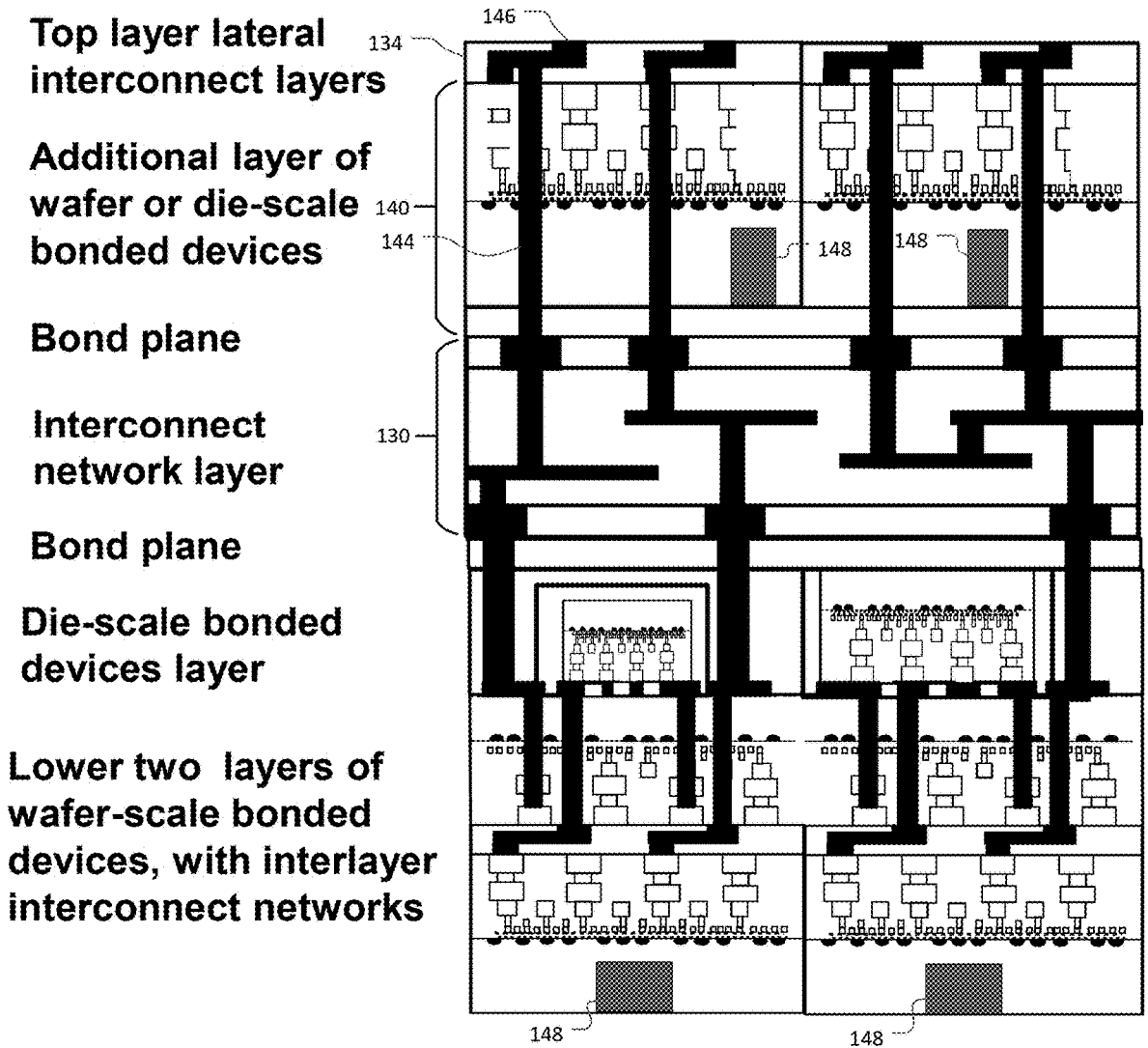
FIG. 17 shows a 3DIC stack with wafer and die-scale device layers and multiple laterals and vertical conductive connections networks in place at each level.

Numerous variations of upper layers that may be formed at S222 are possible. FIGS. 15-17 show a few specific embodiments of additional layers on top of the INL 130.

FIG. 15 illustrates an embodiment in which an adaptive interconnect layer 134 is provided on INL 130. The adaptive interconnect layer 134 may be formed by performing a series of deposition and etching processes on INL 130 to form a plurality of vertical vias 136 and upper bond pads 138. An adaptive interconnect layer 134 may be provided, for example, to compensate for variations in the planarity or flatness of the exposed surface of the INL 130, or to alter one or more interconnection pathway of INL 130. An upper device layer 140, which may be a wafer-scale layer, may be atomic bonded to the exposed upper surface of the adaptive interconnect layer 134.

An adaptive interconnect layer 134 may be used, for example, when an INL 130 has standardized pad locations, and the adaptive interconnect layer adapts the pad locations of the INL 130 to electrode locations of upper device layer 140. The adaptive interconnect layer 134 may be formed by a layer transfer process, or by more conventional photolithography techniques, e.g. a damascene process. Accordingly, an adaptive interconnect layer 134 may be used to adapt an INL 130 to a specific device configuration. Adaptive interconnect layer 134 may have bond pads on a first surface, and may include one or more lateral conductive line that adapts the location of the bond pad of the first surface to a different location on a second surface of the layer 134.

FIG. 16 illustrates an embodiment in which a wafer-scale upper device layer 140 is provided in a face-down orientation on INL 130. In the embodiment of FIG. 16, an adaptive interconnect layer 134 is provided between the INL 130 and the upper device layer 140. The adaptive interconnect layer 134 may be formed on the surface of the INL 130, or on the face of device layer 140 prior to placing the device layer on the INL 130. When the adaptive interconnect layer 134 is formed on the surface of the device layer 140, the adaptive interconnect layer 134 may be atomic bonded to the INL 130. The adaptive interconnect layer 134 may be formed in the course of an aligned bonding process for aligning and bonding device layer 140 to INL 130.

FIG. 17 illustrates an embodiment in which a wafer-scale device group 140 is transferred by a temporary bonding technique combined with an oxide deposition by CVD or spin on methods on the backside of the device layer. The deposited oxide layer provides the opportunity for efficient bonding of the top device layer to the deposited oxide top surface of the device stack, including the INL 130.

Alignment of the vertical metal connections linking the interconnect layers in top layer of top-bonded devices with the location of the metal landing pads may be accomplished with precision align bonding utilizing infra-red inspection of the combined bonded stack. Vertical metal interconnects between the top layer devices, linking to metal landing pads on the top surface of the interconnect network layer 130 can be fabricated after bonding using infra-red vision imaging for mask alignment tasks.

The embodiment shown in FIG. 17 has several features that are different from the embodiment of FIG. 16. In FIG. 17, the upper device layer 140 is shown in a face-up orientation, so that the substrate of the upper device layer faces the INL 130 and circuitry of the upper device layer faces away from the INL. Accordingly, the upper device layer 140 is electrically coupled to INL 130 through vertical connection vias 144. The process S222 of forming upper layers may include forming openings in the upper device layer and depositing a metal material in the openings to form the vertical connection vias 144.

By appropriate choice of metals, precision controls on the relative heights of the bonding layer metal pads and surrounding dielectric surfaces, aligned bonding of metal/metal and dielectric/dielectric bonds can achieved by variations on thermal compression bonding known as "hybrid" bonding. In the embodiment shown in FIG. 16, the contacts for the vertical metal lines between the top layer of devices and the interconnect network layer 130 may be made along a metal/dielectric hybrid bonding plane, while in the face up bonding shown in the embodiment FIG. 16, vertical connections may be made by etch of vertical channels and subsequent backfill with metal on the top device layer substrate after bonding.

In addition, as seen in FIG. 17, a second adaptive interconnect layer 134 may be formed on the exposed surface of upper device layer 140. The second adaptive interconnect layer 134 may provide lateral connections between electrodes of the upper device layer 140 and the vertical connection vias 144. In an embodiment, the second adaptive interconnect layer 134 is formed directly on a surface of upper device layer 140 using a damascene process. Such an embodiment may be more suitable to an adaptive interconnect layer that includes minimal lateral elements and conductive pathways. In addition, the upper device layer 140 may provide contacts 146 on an upper surface, which may be landing pads or contact pads for external connections or for attaching one or more additional device layer.

A major challenge for operation of dense high-performance circuit elements with 3DIC stack arrays, such as micro-processor logic and graphics processors for image analysis and display drivers, is the removal of heat from active device cores. Accordingly, embodiments of a 3DIC stack may further include one or more cooling channel 148. For example, a network of channels 148 for flow of coolant fluids can be formed in close proximity to a heat-generating transistor layer by adjusting the local penetration depth of the hydrogen implant profile by adding a patterned range adjusting layer comprised of materials formed at a sufficient thickness to result in a local offset in the hydrogen depth and subsequent cleave surface, as described in U.S. Pat. No. 10,573,627.

The embodiment of FIG. 17 shows a plurality of coolant channels 148. The coolant channels 148 may be formed, for example, by depositing a proton range offsetting material on an upper surface of a device structure, implanting ions into a substrate of the upper device layer to create a cleave profile, the cleave profile having contours corresponding to contours of the offsetting material, and cleaving the substrate along a cleave plane that defines the shapes of the coolant channels 148. Accordingly, when an LT process is used, the coolant channels may be formed without the need for additional deposition and etching process, resulting in a simplified process. Alternatively, it is possible to form coolant channels by more conventional photolithographic processes.

In an embodiment in which coolant channels 148 are formed in layers other than the bottom layer, the presence of coolant channels may result in a reduced surface for atomic bonding. In such an embodiment, the size and shape of coolant channels 148 may have an aspect ratio with a relatively large depth compared to a width of the channels to minimize the reduction in surface area for the atomic bonded surface while retaining sufficient volume to effectively remove heat from the 3DIC structure.

The second adaptive interconnect layer 134 may be formed on the exposed surface of upper device layer 140 before or after the upper device layer has been bonded to the lower structure. In an embodiment, the upper device layer 140 is a wafer-scale layer that is formed in a first foundry, and the vertical vias 144 and adaptive interconnect layer 134 are formed in a packaging process at an outside assembly and test (OSAT) facility. Similarly, each of the die and device structures may be substrates that are provided at S1002, and process 1000 may be performed as a packaging or assembly process that stacks and interconnects a plurality of devices that may be die-scale or wafer-scale devices, or a mixture of both. In another embodiment, process 1000 is performed at a foundry, which may be the same foundry that forms one or more of the die or wafer-scale device structures.

Each of the wafer scale device layers in a 3DIC according to the present disclosure may be thinned by performing an implantation and cleaving process to remove a thickness of substrate material. In addition, a hydrogen repair process may be performed on each layer to repair damage caused by the implantation process. It is desirable to perform a thermal repair process to repair ion damage with direct access for the ambient gas to the dielectric layers in the metal interconnect network and transistor gate stack regions. Thus, a thermal repair process may be performed prior to sealing each of the electronic device surfaces.

Although the embodiments in the figures have two wafer scale device layers, a single diverse die layer, and an upper wafer scale device layer, embodiments are not limited to that configuration. Embodiments may use different numbers of die or wafer scale layers than the examples shown by the figures. Embodiments may have as few as two, and as many as 10 or even 100 or more device layers in a single vertical stack. Atomic bonding may be used to join each device layer to adjacent layers in a 3DIC device.

In embodiments of the present disclosure, a network of channels for flow of cooling fluids is defined by modulation of implanted Hydrogen depth by a patterned layer of materials at the device wafer surface during Hydrogen implant with thickness, stopping power and location chosen to create a non-planar cleave surface in the transfer device substrate. Similar methods for modulating the depth of the cleave plane may be used to define cooling channels in a selected high-thermal conductivity material layer for subsequent insertion into a laminated multi-layer, multi-device 3DIC stack. In an embodiment, the surface regions of a cooling fluid flow network are coated with material chosen to increase thermal conductivity between the heated device layer and substrate and the flowing cooling fluid, and to prevent chemical reactions between the device substrate and cooling fluids.

Devices formed using the cleaving and stacking techniques provided in this disclosure have numerous advantages over conventional technologies. Embodiments incorporate the advantages of wafer-level bonding processes, including incorporation of cooling fluid network channels, with a design flexibility for incorporation of dies fabricated on different wafer sizes, different wafer thickness and different substrate materials. Substrates that are formed by backgrinding are subject to substantially higher levels of mechanical stress and higher levels of thickness variation and/or roughness variations over the substrate surface. Backgrinding transmits mechanical stresses into a semiconductor substrate which can be stored in the substrate and released as the substrate is exposed, resulting in an uneven surface. Ionic cleaving can be performed with fewer process steps than backgrinding, simplifying the process and reducing the amount of handling required. Layers of the 3DIC structures according to the present disclosure may be interconnected through dense high bandwidth vertical and lateral metal connections, which may displace the need for interposer and solder bump structures, leading to smaller, more tightly integrated, higher speed devices that are more efficient to manufacture.

Interconnect network layers described in this disclosure provide solutions to 1) the challenges associated with effects of proton damage on the materials in the interconnect network and related device issues, and 2) adequate thermal conductivity solutions to maintain operating temperatures during dynamic 3DIC system operation which are consistent with adequate transistor and device reliability as well as stable system performance. In embodiments of the present disclosure, fabrication of interconnect networks on Si wafers can be accomplished with fab tool sets used for normal metal/dielectric interconnect networks, allowing for high-volume stacking of 3DIC system stacks independent of limited supplies of 2.5D packaging interposers. In addition, embodiments may enable foundries to incorporate processes that are conventionally performed at an OSAT facility to the back end of Line (BEOL) processes.

Control of thermal conditions in a high-density 3DIC system may use a variety of methods to spread and conduct away heat generated by Ohmic resistance and other sources of heat generation during dynamic operation of the 3DIC devices.

Conventional 2.5D packaging of multi-die systems contain limitations in materials and scales which are decreased or removed by embodiments of the present disclosure. The area of thermal effects, ball-grid contacts, adhesive layers and interposers used for signal propagation between die components are often composed of specialty metal, glass and plastic materials with different coefficients of thermal expansion (CTE) and lower thermal conductivity than Si, the major component of most IC die used for integration into multi-dimensional systems. Embodiments of the present disclosure may use primarily Si-based materials for substrates and layer transfer materials for construction of the signal propagation interconnects in both vertical and lateral directions. In addition, the vertical scales of the layered components used in 2.5D packaging schemes are considerably larger than the dimensions achievable with layer transfer methods, giving advantages to thermal properties of 3DIC systems fabricated by layer transfer.

One purpose of bonded interconnection networks is to allow for electrical connections beyond the dimension of the individual stacked die or wafer-level device, which is similar to functions provided by many 2.5D packaging techniques. Compared to conventional devices, the interconnect network layers of the present disclosure have substantially thinner physical dimensions and higher I/O connection densities, providing for higher bandwidth 3DIC stacks.

Embodiments address issues of internal 3DIC temperature control by choice of high thermal conductivity materials, use of thin, directly bonded layer interfaces, incorporation/fabrication of channels for cooling fluids formed in conjunction with proton implants for Si cleave surfaces, and address recovery of dielectric layers from local damage associated with the passage of energetic protons through the interconnect network dielectric layers by use of Hydrogen containing atmospheres during post-implant annealing cycles.

Embodiments of the present application have the advantage of providing much higher connection density than conventional interposer technologies. An INL can be formed using a relatively thin substrate of 0.2 to 1 µm. When forming a TSV with a 10:1 L/D ratio, this can result in TSV diameters of 20-100 nm, which is more than an order of magnitude smaller than the 3-10 µm diameters in conventional interposers. Although the exact diameter of TSVs in an INL may vary between embodiments, it should be recognized that technologies of the present application can result in a much higher connection density than is possible using conventional technologies.

While the above is a full description of specific embodiments, various modifications, alternative constructions and equivalents may be used. Therefore, the above description and illustrations should not be taken as limiting the scope of the present disclosure.

The invention claimed is:

1. A method for forming a three-dimensional integrated circuit (3DIC), the method comprising:
   providing an interconnect network layer having an interconnect structure on a semiconductor substrate, the interconnect structure having a first plurality of electrodes, a second plurality of electrodes, and a plurality of connection structures coupling the first plurality of electrodes to the second plurality of electrodes, the first plurality of electrodes being exposed on a first surface of the interconnect layer;
   implanting ions into the semiconductor substrate to form a cleave plane in the semiconductor substrate;
   bonding the interconnect structure to a lower device structure so that electrodes of the first plurality of electrodes are coupled to corresponding electrodes on the lower device structure; and
   cleaving the substrate of the bonded interconnect layer at the cleave plane.

2. The method of claim 1, wherein the ions are implanted through the interconnect structure.

3. The method of claim 1, wherein the ions are implanted before the interconnect structure is formed.

4. The method of claim 1, wherein a substrate of the lower device structure comprises at least one cooling channel.

5. The method of claim 4, further comprising:
   forming the at least one cooling channel by:
   depositing a range adjusting layer on a substrate of the lower device structure;
   implanting ions into the substrate of the lower device structure to form a cleave plane defining a shape of the at least one cooling channel; and
   cleaving the substrate of the lower device structure.

6. The method of claim 5, further comprising:
   forming a coating of a high thermal conductivity material on the at least one cooling channel.

7. The method of claim 1, wherein the interconnect network layer comprises a plurality of lateral connections.

8. The method of claim 1, wherein the interconnect network layer includes conductive interconnect structures that extend in both vertical and lateral directions, the interconnect structures including at least one power interconnect structure, at least one signal interconnect structure, and at least one timing interconnect structure.

9. The method of claim 1, wherein the lower device structure comprises a lower wafer-scale device layer with a plurality of die-scale devices stacked on the lower wafer-scale device layer.

10. The method of claim 1, wherein a thickness of the semiconductor substrate is 1 µm or less after cleaving.

11. A method of forming a three-dimensional integrated circuit (3DIC), the method comprising:
   forming an interconnect network layer having an interconnect structure on a semiconductor substrate, the interconnect structure having a first plurality of electrodes, a second plurality of electrodes, and a plurality of connection structures coupling the first plurality of electrodes to the second plurality of electrodes, the first plurality of electrodes being exposed on a first surface of the interconnect layer;
   implanting ions into the semiconductor substrate to form a cleave plane in the semiconductor substrate;

bonding the interconnect structure to a lower device structure so that electrodes of the first plurality of electrodes are coupled to corresponding electrodes on a lower device structure; and cleaving the substrate of the bonded interconnect layer at the cleave plane.

12. The method of claim 11, wherein the ions are implanted through the interconnect structure.

13. The method of claim 11, wherein the ions are implanted before the interconnect structure is formed.

14. The method of claim 11, wherein a substrate of the lower device structure comprises at least one cooling channel.

15. The method of claim 14, further comprising:

forming the at least one cooling channel by:

depositing a range adjusting layer on a substrate of the lower device structure;

implanting ions into the substrate of the lower device structure to form a cleave plane defining a shape of the at least one cooling channel; and cleaving the substrate of the lower device structure.

16. The method of claim 15, further comprising:

forming a coating of a high thermal conductivity material on the at least one cooling channel.

17. The method of claim 11, wherein the interconnect network layer comprises a plurality of lateral connections.

18. The method of claim 11, wherein the interconnect network layer includes conductive interconnect structures that extend in both vertical and lateral directions, the interconnect structures including at least one power interconnect structure, at least one signal interconnect structure, and at least one timing interconnect structure.

19. The method of claim 11, wherein the lower device structure comprises a lower wafer-scale device layer with a plurality of die-scale devices stacked on the lower wafer-scale device layer.

20. The method of claim 11, wherein a thickness of the semiconductor substrate is 1 µm or less after cleaving.

* * * * *